US008784700B2

(12) United States Patent
Inoue et al.

(10) Patent No.: US 8,784,700 B2
(45) Date of Patent: Jul. 22, 2014

(54) SPUTTERING TARGET AND OXIDE SEMICONDUCTOR FILM

(75) Inventors: Kazuyoshi Inoue, Chiba (JP); Koki Yano, Chiba (JP); Futoshi Utsuno, Chiba (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 971 days.

(21) Appl. No.: 12/518,988

(22) PCT Filed: Nov. 30, 2007

(86) PCT No.: PCT/JP2007/073134
§ 371 (c)(1), (2), (4) Date: Jan. 19, 2010

(87) PCT Pub. No.: WO2008/072486
PCT Pub. Date: Jun. 19, 2008

(65) Prior Publication Data
US 2010/0108502 A1 May 6, 2010

(30) Foreign Application Priority Data

Dec. 13, 2006 (JP) .................................. 2006-335817
Jan. 5, 2007 (JP) .................................. 2007-000417
Jan. 5, 2007 (JP) .................................. 2007-000418
Mar. 5, 2007 (JP) .................................. 2007-054185

(51) Int. Cl.
*H01B 1/02* (2006.01)
(52) U.S. Cl.
USPC .................................................. 252/519.1
(58) Field of Classification Search
USPC .................... 252/500, 518.1, 519.51
See application file for complete search history.

(56) References Cited

U.S. PATENT DOCUMENTS

| 4,660,114 | A | * | 4/1987 | Yamakawa et al. ........... 360/122 |
| 5,622,653 | A | * | 4/1997 | Orita et al. ................. 252/519.1 |
| 7,453,065 | B2 | | 11/2008 | Saito et al. |
| 7,635,440 | B2 | | 12/2009 | Hosono et al. |
| 7,682,529 | B2 | | 3/2010 | Osada et al. |
| 2004/0180217 | A1 | * | 9/2004 | Inoue et al. .................. 428/432 |
| 2005/0147780 | A1 | * | 7/2005 | Jin et al. ........................ 428/38 |
| 2006/0108529 | A1 | | 5/2006 | Saito et al. |
| 2006/0108636 | A1 | | 5/2006 | Sano et al. |
| 2006/0110867 | A1 | | 5/2006 | Yabuta et al. |
| 2006/0113536 | A1 | | 6/2006 | Kumomi et al. |
| 2006/0113539 | A1 | | 6/2006 | Sano et al. |

(Continued)

FOREIGN PATENT DOCUMENTS

| EP | 1 422 312 | 5/2005 |
| JP | 6344820 | 2/1988 |

(Continued)

OTHER PUBLICATIONS

Kimizuka, N., et al., J. Solid State Chemistry, 116, pp. 170-178 (1995).*

(Continued)

*Primary Examiner* — Mark Kopec
*Assistant Examiner* — William Young
(74) *Attorney, Agent, or Firm* — Millen, White, Zelano & Branigan, P.C.

(57) ABSTRACT

A sputtering target containing oxides of indium (In), gallium (Ga) and zinc (Zn), which includes a compound shown by $ZnGa_2O_4$ and a compound shown by $InGaZnO_4$.

10 Claims, 9 Drawing Sheets

(56) References Cited

U.S. PATENT DOCUMENTS

| | | |
|---|---|---|
| 2006/0113565 A1 | 6/2006 | Abe et al. |
| 2008/0251729 A1 | 10/2008 | Saito et al. |
| 2008/0290286 A1 | 11/2008 | Saito et al. |

FOREIGN PATENT DOCUMENTS

| | | |
|---|---|---|
| JP | 63210022 A | 8/1988 |
| JP | 63210022 W | 8/1988 |
| JP | 63210023 A | 8/1988 |
| JP | 63210023 W | 8/1988 |
| JP | 63210024 A | 8/1988 |
| JP | 63210024 W | 8/1988 |
| JP | 63239117 A | 10/1988 |
| JP | 63239117 W | 10/1988 |
| JP | 63265818 A | 11/1988 |
| JP | 63265818 W | 11/1988 |
| JP | 8 245220 | 9/1996 |
| JP | 8295514 A | 11/1996 |
| JP | 08295514 W | 11/1996 |
| JP | 8330103 A | 12/1996 |
| JP | 08330103 W | 12/1996 |
| JP | 9-25564 | 1/1997 |
| JP | 9035670 A | 2/1997 |
| JP | 09035670 W | 2/1997 |
| JP | 09 071860 | 3/1997 |
| JP | 09 259640 | 10/1997 |
| JP | 10045496 A | 2/1998 |
| JP | 10045496 W | 2/1998 |
| JP | 10 204669 | 8/1998 |
| JP | 10 297962 | 11/1998 |
| JP | 10306367 A | 11/1998 |
| JP | 10306367 W | 11/1998 |
| JP | 11 322334 | 11/1999 |
| JP | 11 322335 | 11/1999 |
| JP | 2000 026119 | 1/2000 |
| JP | 200044236 A | 2/2000 |
| JP | 2000044236 W | 2/2000 |
| JP | 2001 131736 | 5/2001 |
| JP | 2002 356767 | 12/2002 |
| JP | 2004 134454 | 4/2004 |
| JP | 2005307269 A | 11/2005 |
| JP | 2005307269 W | 11/2005 |
| JP | 2006165527 A | 6/2006 |
| JP | 2006165527 W | 6/2006 |
| JP | 2006165528 A | 6/2006 |
| JP | 2006165529 A | 6/2006 |
| JP | 2006165530 A | 6/2006 |
| JP | 2006165531 A | 6/2006 |
| JP | 2006165532 A | 6/2006 |
| JP | 2006173580 A | 6/2006 |
| JP | 2006 210033 | 8/2006 |
| JP | 2007223849 A | 9/2007 |
| JP | 2007223849 W | 9/2007 |
| WO | WO-00 40769 | 7/2000 |
| WO | WO-00 68456 | 11/2000 |
| WO | 03014409 A1 | 2/2003 |
| WO | WO-2004 079038 | 9/2004 |
| WO | WO-2007 000878 | 1/2007 |
| WO | 2007073134 R | 3/2008 |

OTHER PUBLICATIONS

Nikko Materials Co Ltd., "Method for Manufacturing Izo Sputtering Target," Patent Abstracts of Japan, Publication Date: Dec. 13, 2002; English Abstract of JP-2002 356767.

Mitsubishi Materials Corp., "Gallium Oxide and its Production," Patent Abstracts of Japan, Publication Date: Nov. 24, 1999; English Abstract of JP 11-322335.

Mitsubishi Materials Corp., "Production of Indium Oxide Powder," Patent Abstracts of Japan, Publication Date: Aug. 4, 1998; English Abstract of JP 10-204669.

Mitsubishi Materials Corp., "Gallium Oxide Powder Having Excellent Sinterability," Patent Abstracts of Japan, Publication Date: Nov. 24, 1999; English Abstract of JP 11-322334.

"Powder Diffraction File—Set 38 Inorganic and Organic" International Centre for Diffraction Data, 1988, p. 403 and 457.

Translation of relevant parts of JP-2002-356767 (Dec. 13, 2002), JP-11-322335(Nov. 24, 1999), JP-10-204669 (Aug. 4, 1998), and JP-11-322334 (Nov. 24, 1999).

Sumitomo Metal Mining Co Ltd., "Zno—GA2O3-Based Sintered Compact for Sputtering Target and Production of the Sintered Compact," Patent Abstracts of Japan, Publication Date: Nov. 11, 1998; English Abstract of JP 10-297962.

Translation of Relevant parts of JP-10-297962 (Nov. 10, 1998) and WO-2000 040769 (Jul. 13, 2000).

Nakamura, M. et al., "The Phase Relations in the $In_2O_3$—$Ga_2ZnO_4$—ZnO System at 1350° C.," Journal of Solid State Chemistry, 1991, vol. 93, pp. 298-315.

Hoya Corp., "Article having transparent electricity conductive oxide thin film and it manufacture," Patent Abstracts of Japan, Publication Date: Jan. 25, 2000; English Abstract of JP-2000 026119.

Idemitsu Kosan Co Ltd., "Target and Its Production," Patent Abstract of Japan, Publication Date: Mar. 18, 1997; English Abstract of JP 09-071860.

Nikko Materials Co Ltd., "Sputtering target and method of manufacture," Patent Abstract of Japan, Publication Date: May 15, 2001; English Abstract of JP 2001 131736.

Minami et al., "Transparent Conductive Film," Patent Abstracts of Japan, Publication Date: Oct. 3, 1997; English Abstract of JP 09 259640.

Yabuta, H. et al., "High-mobility thin-film transistor with amorphouse $InGaZnO_4$ channel fabricated by room temperature rf-magnetron sputtering," Applied Physics Letters, 2006, vol. 89.

Nakamura et al., Solid-state Physics, 1993, vol. 28, No. 5, pp. 45-55.

Translation of relevant parts of Nakamura et al., Solid-state Physics, 1993, vol. 28, No. 5, pp. 45-55, JP-2000-26119 (Jan. 25, 2000), JP-9-71860 (Mar. 18, 1997) ,JP-2001 131736 (May 15, 2001), and JP-9-259640 (Oct. 3, 1997).

Toyota Central Res & Dev Lab Inc., "Thermoelectric conversion material and its manufacturing method," Patent Abstract of Japan, Publication Date: Apr. 30, 2004; English Abstract of JP 2004 134454.

Japan Energy Corp., "Sputtering Target and Production Method Therefor," Data Supplied from the espacenet database, Publication Date: Nov. 16, 2000; English Abstract of WO 00 68456.

Idemitsu Kosan Co Ltd., "Laminated circuit board having al wiring and coated with transparent conductive film, and manufacturing method thereof," Patent Abstracts of Japan, Publication Date: Aug. 10, 2006; English Abstract of JP 2006 210033.

Translation of relevant parts of JP-2004 134454 (Apr. 30, 2004), WO 00 68456 (Nov. 16, 2000), and JP 2006 210033(Aug. 10, 2006).

Kammler, D. R. et al., "Novel Compound and Solid-Solution Transparent Conducting Oxides for Photovoltaics," Electrochemical Society Proceedings, 2007, vol. 99, pp. 68-77.

Jeong, In-Keun et al. "Photoluminescenece of $ZnGa_2O_4$ Mixed with $InGaZnO_4$." (Solid State Communications), 1998, 823-826, 108: 11.

Written Opinion. PCT/JP2007/073134. Mailed Jun. 25, 2009.

Patent Abstract and English Translation of JP Publication No. 08-295514. Publication Date: Nov. 12, 1996. Application No. 07-101321. Filing Date: Apr. 25, 1995. Inventor: Orita Masahiro et al. Title: "Electrically Conductive Oxide and Electrode Using the Same" Applicant: Hoya Corp. (Patent Abstracts of Japan).

European Extended Search Report dated Nov. 6, 2013 in corresponding EP Patent Application No. 13 18 1009.5. (8 pages).

English Abstract of Japanese Publication 09-025564. "Aluminum or Aluminum Alloy Sputtering Target". Jan. 28, 1997. Fukuyo Hideaki et al. Application No. 07-192619. Jul. 6, 1995. Japan Energy Corp.

Machine English translation of Japanese Publication 09-025564. "Aluminum or Aluminum Alloy Sputtering Target"Jan. 28, 1997. Fukuyo Hideaki et al. Application No. 07-192619. Jul. 6, 1995. Japan Energy Corp.

\* cited by examiner

SPUTTERING TARGET AND OXIDE SEMICONDUCTOR FILM

TECHNICAL FIELD

The invention relates to a sputtering target and an oxide semiconductor film.

BACKGROUND ART

An oxide semiconductor film comprising a metal complex oxide has a high degree of mobility and visible light transmission, and is used as a switching device, a driving circuit device or the like of a liquid crystal display, a thin film electroluminescence display, an electrophoresis display, a moving particle display or the like.

Examples of an oxide semiconductor film comprising a metal complex oxide include an oxide semiconductor film comprising an oxide of In, Ga and Zn (IGZO). An oxide semiconductor film obtained by using an IGZO sputtering target has an advantage that it has a higher mobility than that of an amorphous silicon film, and hence has been attracting attention (see Patent Documents 1 to 10).

An IGZO target is known to be composed mainly of a compound shown by $InGaO_3(ZnO)_m$ (wherein m is an integer of 1 to 20). However, if sputtering (DC sputtering, for example) is conducted by using an IGZO sputtering target, a problem arises that the compound shown by $InGaO_3(ZnO)_m$ grows abnormally to cause abnormal discharge, leading to the formation of a defective film.

Furthermore, an IGZO sputtering target is produced by mixing raw material powder to form a mixture, prefiring, pulverizing, granulating and molding the mixture to form a molded product, and sintering and reducing the molded product. However, due to a large number of steps, this process has a disadvantage that the productivity of a sputtering target is lowered, resulting in an increased production cost.

Therefore, it is preferable to omit even one of these steps. However, no improvement has heretofore been made on the production process, and an IGZO target is being produced by a conventional process.

In addition, the sputtering target obtained by conventional processes has a conductivity of about 90 S/cm (specific bulk resistance: 0.011 Ωcm); in other words, has a high resistance. It is difficult to obtain by conventional processes a target which does not suffer from cracking or other problems during sputtering.

Compounds, which are contained in an IGZO target and shown by $InGaO_3(ZnO)_2$, $InGaO_3(ZnO)_3$, $InGaO_3(ZnO)_4$, $InGaO_3(ZnO)_5$ and $InGaO_3(ZnO)_7$, as well as the production method thereof are disclosed in Patent Documents 11 to 15.

However, compounds shown by $ZnGa_2O_4$ and $InGaZnO_4$ are not obtained in Patent Documents 11 to 15. As for the particle size of the raw material powder used in Patent Documents 11 to 15, these patent documents only state that a particularly preferred particle size is 10 µm or less. Furthermore, although these patent documents state that these compounds can be used in a semiconductor device, no statement is made on the specific resistance value thereof and the use thereof in a sputtering target.

Patent Document 1: JP-A-H8-295514
Patent Document 2: JP-A-H8-330103
Patent Document 3: JP-A-2000-044236
Patent Document 4: JP-A-2006-165527
Patent Document 5: JP-A-2006-165528
Patent Document 6: JP-A-2006-165529
Patent Document 7: JP-A-2006-165530
Patent Document 8: JP-A-2006-165531
Patent Document 9: JP-A-2006-165532
Patent Document 10: JP-A-2006-173580
Patent Document 11: JP-A-S63-239117
Patent Document 12: JP-A-S63-210022
Patent Document 13: JP-A-S63-210023
Patent Document 14: JP-A-S63-210024
Patent Document 15: JP-A-S63-265818

DISCLOSURE OF THE INVENTION

An object of the invention is to provide a sputtering target which can suppress abnormal discharge which occurs during formation of an oxide semiconductor film by the sputtering method, and is capable of forming an oxide semiconductor film which is improved in surface smoothness without film quality disorders.

Another object of the invention is to provide a sputtering target which maintains the properties of an IGZO sputtering target, has a low bulk resistance, a high density, and more uniform-fine-particle-size structure, as well as a high degree of transverse rupture strength.

Still another object of the invention is to provide a sputtering target which can suppress occurrence of abnormal discharge even though it is an IGZO sputtering target and is used in DC sputtering.

Further another object of the invention is to provide a method for producing a sputtering target which can shorten the production process without impairing the properties of an IGZO sputtering target.

The inventors have found that, in an IGZO sputtering target which contains an oxide of indium (In), gallium (Ga) and zinc (Zn), a compound shown by $ZnGa_2O_4$ inhibits abnormal growth of a compound shown by $InGaO_3(ZnO)_m$ (wherein m is an integer of 2 to 20), whereby abnormal discharge during sputtering can be suppressed, and a compound shown by $InZnGaO_4$ inhibits abnormal growth of a compound shown by $InGaO_3(ZnO)_m$ (wherein m is an integer of 2 to 20), whereby abnormal discharge during sputtering can be suppressed.

In addition, the inventors have found that, the bulk resistance of a sputtering target itself can be reduced by adding a metal element with an atomic valency of positive tetravalency or higher, whereby abnormal discharge can be suppressed (First Invention).

Furthermore, the inventors have found that, occurrence of abnormal discharge during sputtering can be suppressed by adding to an IGZO sputtering target which comprises $InGaZnO_4$ as a main component a metal element with an atomic valency of positive tetravalency or higher (Second Invention).

In addition, the inventors have found that, in the method for producing an IGZO sputtering target, the prefiring step and the reduction step can be omitted by mixing/pulverizing, according to a specific mixing/pulverizing method, indium oxide, gallium oxide and zinc oxide, or raw material powder containing them as main components, thereby to adjust the specific surface area or the median diameter of the raw material mixed powder and the powder after pulverization (Third Invention).

The invention provides the following sputtering target or the like.

First Invention

First Embodiment

1. A sputtering target containing oxides of indium (In), gallium (Ga) and zinc (Zn), which comprises a compound shown by $ZnGa_2O_4$ and a compound shown by $InGaZnO_4$.

2. The sputtering target according to 1, wherein an atomic ratio shown by In/(In+Ga+Zn), an atomic ratio shown by Ga/(In+Ga+Zn) and an atomic ratio shown by Zn/(In+Ga+Zn) satisfy the following relationship:

0.2<In/(In+Ga+Zn)<0.77

0.2<Ga/(In+Ga+Zn)<0.50

0.03<Zn/(In+Ga+Zn)<0.50.

3. The sputtering target according to 1 or 2, wherein the atomic ratio shown by In/(In+Ga+Zn) and the atomic ratio shown by Ga/(In+Ga+Zn) satisfy the following relationship:

In/(In+Ga+Zn)>Ga/(In+Ga+Zn).

4. The sputtering target according to any one of 1 to 3, wherein the sputtering target comprises a metal element with an atomic valency of positive tetravalency or higher, and the content of the metal element with an atomic valency of positive tetravalency or higher relative to the total metal elements [metal element with an atomic valency of positive tetravalency or higher/total metal elements: atomic ratio] is 0.0001 to 0.2.

5. The sputtering target according to 4, wherein the metal element with an atomic valency of positive tetravalency or higher is one or more elements selected from tin, zirconium, germanium, cerium, niobium, tantalum, molybdenum and tungsten.

6. The sputtering target according to any one of 1 to 5, which has a bulk resistance of less than $5 \times 10^{-3}$ Ωcm.

7. An oxide semiconductor film which is obtained by film formation by sputtering using the sputtering target according to any one of 1 to 6.

First Invention

Second Embodiment

1. A sputtering target containing oxides of indium (In), gallium (Ga) and zinc (Zn), which comprises a homologous structure compound shown by $InGaO_3(ZnO)_m$ (wherein m is an integer of 1 to 20) and a spinel structure compound shown by $ZnGa_2O_4$.

2. The sputtering target according to 1, which comprises at least a homologous structure compound shown by $InGaZO_4$.

3. The sputtering target according to 1 or 2, wherein the spinel structure compound shown by $ZnGa_2O_4$ has an average particle diameter of 10 μm or less.

4. The sputtering target according to any one of 1 to 3, which has a sintered body density of 6.0 g/cm³ or more.

5. The sputtering target according to any one of 1 to 4, which has a surface roughness (Ra) of 2 μm or less and an average transverse rupture strength of 50 MPa or more.

6. The sputtering target according to any one of 1 to 5, wherein the content of each of Fe, Al, Si, Ni and Cu is 10 ppm (weight) or less.

7. A method of producing a sputtering target according to any one of 1 to 6 comprising the steps of:
pulverizing and mixing/granulating indium oxide, gallium oxide and zinc oxide to prepare a mixture;
molding the mixture to obtain a molded product; and
sintering the molded product in an oxygen stream or under an oxygen pressure at a temperature of 1250° C. or higher and lower than 1450° C.

8. An oxide semiconductor film which is obtained by film formation by sputtering using the sputtering target according to any one of 1 to 6.

Second Invention

1. A sputtering target comprising a compound shown by $InGaZnO_4$ as a main component, which further contains a metal element with an atomic valency of positive tetravalency or higher.

2. The sputtering target according to 1, wherein the content of the metal element with an atomic valency of positive tetravalency or higher is 100 ppm to 10000 ppm relative to the total metal elements in the sputtering target.

3. The sputtering target according to 1, wherein the content of the metal element with an atomic valency of positive tetravalency or higher is 200 ppm to 5000 ppm relative to the total metal elements in the sputtering target.

4. The sputtering target according to 1, wherein the content of the metal element with an atomic valency of positive tetravalency or higher is 500 ppm to 2000 ppm relative to the total metal elements in the sputtering target.

5. The sputtering target according to any one of 1 to 4, which has a bulk resistance of less than $1 \times 10^{-3}$ Ωcm.

6. The sputtering target according to any one of 1 to 5, wherein the metal element with an atomic valency of positive tetravalency or higher is at least one element selected from the group consisting of tin, zirconium, germanium, cerium, niobium, tantalum, molybdenum and tungsten.

Third Invention

1. A method for producing a sputtering target comprising the steps of:
preparing, as raw material powder, mixed powder containing indium oxide powder having a specific surface area of 6 to 10 m²/g, gallium oxide powder having a specific surface area of 5 to 10 m²/g and zinc oxide powder having a surface area of 2 to 4 m²/g, the specific surface area of the entire mixed powder being 5 to 8 m²/g;
mixing/pulverizing the raw material powder by means of a wet medium stirring mill to increase the specific surface area of the entire mixed powder by 1.0 to 3.0 m²/g;
molding the raw material powder to obtain a molded product; and
sintering the molded product in an oxygen atmosphere at a temperature of 1250 to 1450° C.

2. A method for producing a sputtering target comprising the steps of:
preparing, as raw material powder, mixed powder containing indium oxide powder having a median diameter of particle size distribution of 1 to 2 μm, gallium oxide powder having a median diameter of particle size distribution of 1 to 2 μm and zinc oxide powder having a median diameter of particle size distribution of 0.8 to 1.6 μm, the median diameter of particle size distribution of the entire mixed powder being 1.0 to 1.9 μm;
mixing/pulverizing the raw material powder by means of a wet medium stirring mill to allow the raw material powder to have a median diameter of 0.6 to 1 μm;
molding the raw material powder to obtain a molded product; and
sintering the molded product in an oxygen atmosphere at a temperature of 1250 to 1450° C.

3. The method for producing a sputtering target according to 1 or 2, wherein the sintering is performed without conducting prefiring.

4. The method for producing a sputtering target according to any one of 1 to 3, wherein the density of a sintered body obtained in the sintering step is 6.0 g/cm$^3$ or more.

According to the invention, it is possible to provide a sputtering target which can suppress abnormal discharge which occurs when an oxide semiconductor film is formed by the sputtering method and is capable of forming an oxide semiconductor film which is free from film quality disorders and has improved surface smoothness.

BEST MODE FOR CARRYING OUT THE INVENTION

First Invention

First Embodiment

Figure 1:
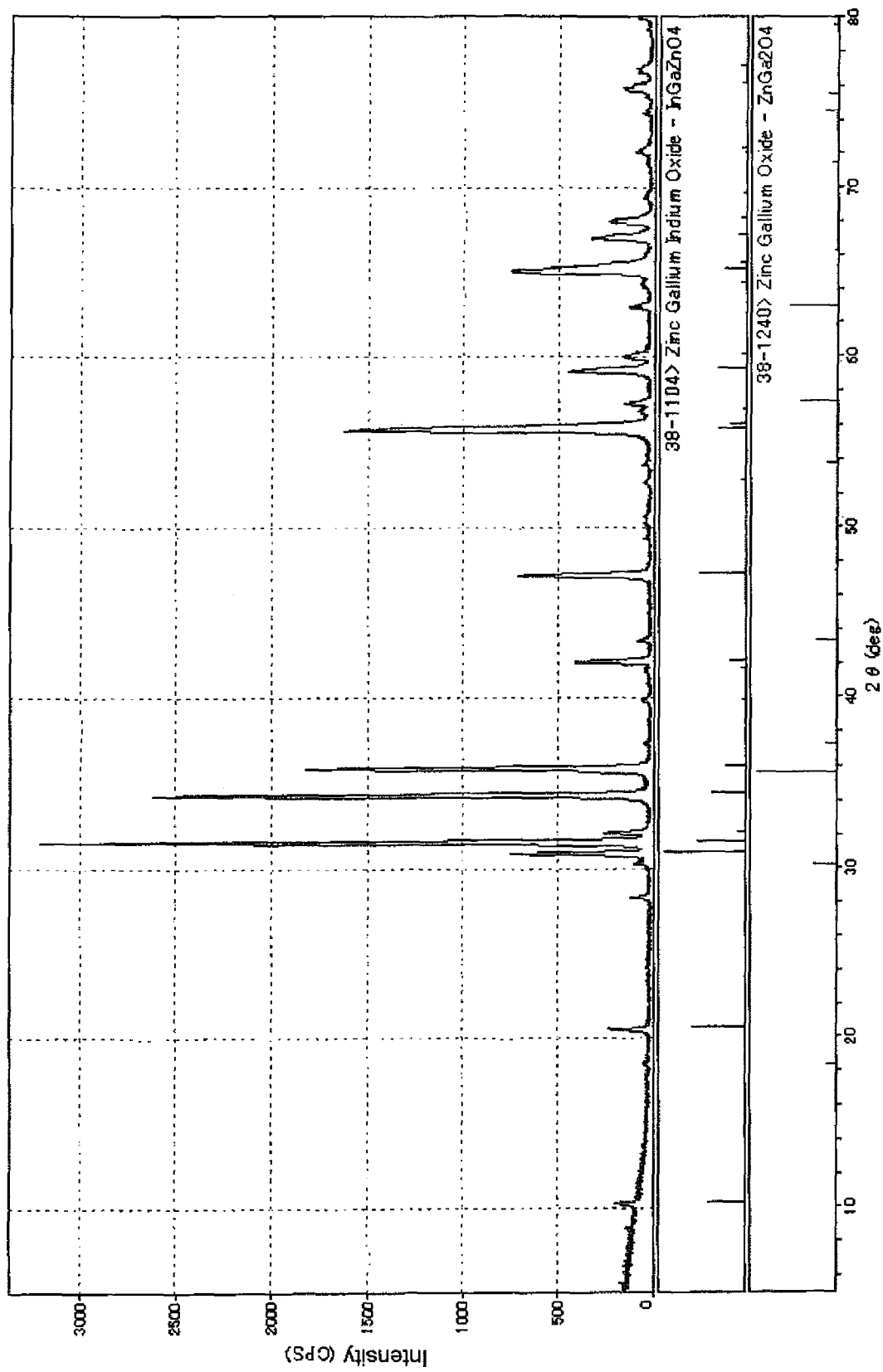
FIG. 1 is an X-ray chart of a target prepared in Example 1.

The sputtering target of the invention (hereinafter often referred to as "the target of the invention") contains oxides of indium (In), gallium (Ga) and zinc (Zn), and comprises a compound shown by $ZnGa_2O_4$ and a compound shown by $InGaZnO_4$.

By allowing a compound shown by $ZnGa_2O_4$ and a compound shown by $InGaZnO_4$ to be generated in a sputtering target, abnormal growth of a compound shown by $InGaO_3(ZnO)_m$ (wherein m is an integer of 2 to 20) can be suppressed, and abnormal discharge of the sputtering during sputtering can be suppressed. In addition, since the crystal particle size can be reduced, oxygen deficiency is generated in the crystal interface, whereby bulk resistance can be reduced.

In addition, the sputtering target of the invention contains a plurality of crystal systems such as a compound shown by $InGaO_3(ZnO)_m$ (wherein m is an integer of 2 to 20) and a compound shown by $ZnGa_2O_4$, oxygen deficiency occurs due to the incommensuration of crystals in the crystal grain boundary, and as a result, carriers are generated in the target. These carriers lower the resistance of the target, whereby abnormal discharge during sputtering can be suppressed.

In the sputtering target of the invention, it is preferred that an atomic ratio shown by In/(In+Ga+Zn), an atomic ratio shown by Ga/(In+Ga+Zn) and an atomic ratio shown by Zn/(In+Ga+Zn) satisfy the following relationship:

0.2<In/(In+Ga+Zn)<0.77

0.2<Ga/(In+Ga+Zn)<0.50

0.03<Zn/(In+Ga+Zn)<0.50.

The above-mentioned atomic ratios are obtained by adjusting the mixing ratio of the indium compound, the gallium compound and the zinc compound before sintering, which will be mentioned later.

If the In/(In+Ga+Zn) is 0.77 or more, the conductivity of the resulting oxide semiconductor film may be increased, making it difficult to be used as a semiconductor. If the In/(In+Ga+Zn) is 0.2 or less, the oxide semiconductor film obtained by film formation may have a lowered carrier mobility when used as a semiconductor.

If the Ga/(In+Ga+Zn) is 0.5 or more, when used as a semiconductor, the carrier mobility of the oxide semiconductor film obtained by film formation may be lowered. On the other hand, if the Ga/(In+Ga+Zn) is 0.2 or less, the conductivity of the oxide semiconductor film obtained by film formation may be increased, making it difficult to be used as a semiconductor. In addition, the semiconductor properties may be varied or the threshold voltage (Vth) shift may be increased due to disturbance such as heating.

If the Zn/(In+Ga+Zn) is 0.03 or less, the oxide semiconductor film may be crystallized. On the other hand, if the Zn/(In+Ga+Zn) is 0.5 or more, the oxide semiconductor film itself may not have sufficient stability, resulting in an increased Vth shift.

The atomic ratio of each element in the above-mentioned target can be obtained by measuring the amount of each element by ICP (Inductively Coupled Plasma).

In the sputtering target of the invention, the atomic ratio shown by In/(In+Ga+Zn) and the atomic ratio shown by Ga/(In+Ga+Zn) preferably satisfy the following formula:

In/(In+Ga+Zn)>Ga/(In+Ga+Zn).

The sputtering target satisfying this formula is capable of producing an oxide semiconductor film which has a high degree of stability, the suppressed Vth shift, and long-term stability.

The sputtering target of the invention preferably contains a metal element with an atomic valency of positive tetravalency or higher, and the content of the metal element with an atomic valency of positive tetravalency or higher relative to the total metal elements [metal element with an atomic valency of positive tetravalency or higher/total metal elements: atomic ratio] is 0.0001 to 0.2.

Since the sputtering target contains a metal element with an atomic valency of positive tetravalency of higher, the target itself has a reduced bulk resistance, whereby occurrence of abnormal discharge during sputtering by the target can be suppressed.

If the content ratio [metal element with an atomic valency of positive tetravalency or higher/total metal elements: atomic ratio] is less than 0.0001, the effects of decreasing the bulk resistance may be small. On the other hand, if the content ratio [metal element with an atomic valency of positive tetravalency or higher/total metal elements: atomic ratio] exceeds 0.2, the stability of the oxide semiconductor film may be lowered.

Examples of preferred metal element with an atomic valency of positive tetravalency or higher include tin, zirconium, germanium, cerium, niobium, tantalum molybdenum and tungsten. Of these, tin, cerium and zirconium are more preferable.

The above-mentioned metal element with an atomic valency of positive tetravalency or higher is added, for example, as a metal oxide, to the raw materials of the sputtering target such that the content of metal element falls within the above-mentioned range.

In addition to the above-mentioned metal element with an atomic valency of positive tetravalency or higher, the sputtering target of the invention may contain, for example, hafnium, rhenium, titanium, vanadium or the like within an amount range which does not impair the advantageous effects of the invention.

Second Embodiment

The sputtering target of the invention (hereinafter often referred to as the target of the invention) contains oxides of indium (In), gallium (Ga) and zinc (Zn), and comprises a homologous compound shown by $InGaO_3(ZnO)_m$ (m is an integer of 1 to 20) and a spinel structure compound shown by $ZnGa_2O_4$.

The homologous compound is a compound having a homologous phase.

The homologous phase (Homologous Series) is, for example, a magneli phase shown by a compositional formula $Ti_nO_{2n-1}$, taking n as a natural number. In such a phase, there are a series of compounds in which n varies continuously.

Specific examples of the homologous compound include $In_2O_3(ZnO)_m$ (wherein m is an integer of 2 to 20), $InGaO_3(ZnO)_m$ (wherein m is an integer of 2 to 20), or the like.

As described in "Crystal Chemistry" (Mitsuoki Nakahira, Kodansha, 1973) or the like, an $AB_2X_4$ type or an $A_2BX_4$ type is called a spinel structure, and a compound having such a crystal structure is generally called a spinel structure compound.

In a common spinel structure, anions (usually oxygen) are filled by cubic closest packing with cations being present in part of tetrahedron or octahedron clearances.

A substituted-type solid solution in which some of the atoms and ions in the crystal structure are replaced with other atoms and an interstitial solid solution in which other atoms are added to the sites between gratings are also included in the spinel structure compounds.

The crystal conditions of the compound in the target can be judged by observing a sample extracted from the target (sintered body) by the X-ray diffraction method.

The spinel structure compound constituting the target of the invention is a compound shown by $ZnGa_2O_4$. That is, in the X-ray diffraction, the compound shows a peak pattern of No. 38-1240 or an analogous (shifted) pattern of the Joint Committee on Powder Diffraction Standards (JCPDS) database.

By allowing a compound shown by $ZnGa_2O_4$ to be formed in the sputtering target, abnormal growth of a compound shown by $InGaO_3(ZnO)_m$ (wherein m is an integer of 2 to 20) can be suppressed, whereby abnormal discharge of a target during sputtering can be suppressed. Preferably, by allowing a compound shown by $InGaZnO_4$ to be formed, abnormal growth of a compound shown by $InGaO_3(ZnO)_m$ (wherein m is an integer of 2 to 20) can be further suppressed.

By suppressing abnormal growth of a compound shown by $InGaO_3(ZnO)_m$ (wherein m is an integer of 2 to 20), it is possible to increase the transverse rupture strength of the target, whereby cracking of the target during sputtering can be suppressed.

Since the sputtering target of the invention contains a plurality of crystal systems of the homologous structure compound shown by $InGaO_3(ZnO)_m$ (wherein m is an integer of 1 to 20) and the spinel structure compound shown by $ZnGa_2O_4$, oxygen deficiency occurs due to the incommensuration of the crystals in the crystal grain boundary, and as a result, carriers are generated in the target. These carriers lower the resistance of the target, whereby abnormal discharge during sputtering can be suppressed.

In the target of the invention, the average particle size of the spinel structure compound shown by $ZnGa_2O_4$ is preferably 10 μm or less, more preferably 5 μm or less.

By allowing the average particle size of the spinel structure compound shown by $ZnGa_2O_4$ to be 10 μm or less, the particle growth of the compound shown by $InGaO_3(ZnO)_m$ (wherein m is an integer of 2 to 20) can be more surely suppressed, and the transverse rupture strength of the target can be increased, whereby cracking of the target during sputtering is suppressed.

The average particle size of the above-mentioned spinel structure compound shown by $ZnGa_2O_4$ can be evaluated by observing a secondary electron image of a scanning electron microscope (SEM), for example.

The sputtering target of the above-mentioned first and second embodiments preferably has a bulk resistance of less than $5 \times 10^{-3}$ Ωcm, more preferably less than $2 \times 10^{-3}$ Ωcm. If the bulk resistance is $5 \times 10^{-3}$ Ωcm or more, abnormal discharge may be induced during sputtering and foreign matters (nodules) may be generated.

The bulk resistance of the target of the invention can be measured by the four probe method.

The sputtering target of the invention preferably has a sintered body density of 6.0 g/cm$^3$ or more.

By allowing the density of a sintered body of the target to be 6.0 g/cm$^3$ or more, the transverse rupture strength of the target can be increased, thereby suppressing cracking of the target during sputtering. On the other hand, if the density of a sintered body of the target is less than 6.0 g/cm$^3$, the target surface may be blackened to cause abnormal discharge.

In order to obtain a high-density sintered body, it is preferable to perform molding by the cold isostatic press (CIP) method, the hot isostatic press (HIP) method, or the like.

It is preferred that the target of the invention have a surface roughness (Ra) of 2 μm or less and an average transverse rupture strength of 50 MPa or more. More preferably, the target of the invention has a surface roughness (Ra) of 0.5 μm or less and an average transverse rupture strength of 55 MPa or more.

By allowing the surface roughness (Ra) of the target to be 2 μm or less, the average transverse rupture strength of the target can be maintained 50 MPa or more, whereby cracking of the target during sputtering can be suppressed.

The surface roughness (Ra) can be measured by the AFM method and the average rupture transverse strength can be measured according to JIS R 1601.

It is preferred that the target of the invention contain Fe, Al, Si, Ni and Cu in an amount of 10 ppm (weight) or less.

Fe, Al, Si, Ni and Cu are the impurities of the target of the invention. By allowing the content of each of Fe, Al, Si, Ni and Cu to be 10 ppm (weight) or less, variation in the threshold voltage of an oxide semiconductor film obtained by film formation using this target can be suppressed, whereby stable operation conditions can be obtained.

The content of the above-mentioned impurity elements can be measured by the inductively coupled plasma (ICP) spectrophotometry.

In addition to oxides of indium (In), gallium (Ga) and zinc (Zn), the sputtering target of the invention may contain a metal element with an atomic valency of positive tetravalency within an amount range which does not impair the advantageous effects of the invention.

An oxide semiconductor film obtained by using the sputtering target of the invention is amorphous, and exhibits stable semiconductor properties without the effects of carrier generation (doping effects) even though a metal element with an atomic valency of positive tetravaleny is contained.

Method for Producing a Sputtering Target

The sputtering target of the above-mentioned first and second embodiments can be produced, for example, by pulverizing and mixing/granulating indium oxide, gallium oxide and zinc oxide to prepare a mixture, molding the mixture to obtain a molded product, and subjecting the molded product to a heat treatment in an oxygen stream or under an oxygen pressure at a temperature of 1250° C. or higher and lower than 1450° C.

The raw materials of the sputtering target of the invention are indium oxide, gallium oxide and zinc oxide. Preferably, the raw materials of the sputtering target are indium oxide powder with a specific area of 6 to 10 m$^2$/g, gallium oxide powder with a specific area of 5 to 10 m$^2$/g and zinc oxide powder with a specific area of 2 to 4 m$^2$/g, or indium oxide powder with a median diameter of 1 to 2 µm, gallium oxide powder with a median diameter of 1 to 2 µm and zinc oxide powder with a median diameter of 0.8 to 1.6 µm.

The purity of each of the above-mentioned raw materials is normally 2N (99 mass %) or more, preferably 3N (99.9 mass %) or more, and more preferably 4N (99.99 mass %) or more. If the purity is lower than 2N, a large amount of impurities such as Fe, Al, Si, Ni and Cu may be contained. Due to the presence of these impurities, troubles occur that the operation of an oxide semiconductor film prepared by using this target becomes unstable or the like.

A common pulverizer may be used for pulverizing the above-mentioned raw materials. For example, the raw materials can be uniformly mixed and pulverized by means of a wet medium stirring mill, a beads mill, or an ultrasonic apparatus.

The raw materials are weighed such that the mixing ratio In:Ga:Zn becomes 45:30:25 in weight ratio (In:Ga:Zn=1:1:1 in molar ratio) or In$_2$O$_3$:Ga$_2$O$_3$:ZnO becomes 51:34:15 in weight ratio (In$_2$O$_3$:Ga$_2$O$_3$:ZnO=1:1:1 in molar ratio).

The raw materials are mixed such that, in the sputtering target of the invention, an atomic ratio shown by In/(In+Ga+Zn), an atomic ratio shown by Ga/(In+Ga+Zn) and an atomic ratio shown by Zn/(In+Ga+Zn) satisfy the following formulas, for example.

$$0.2<In/(In+Ga+Zn)<0.77$$

$$0.2<Ga/(In+Ga+Zn)<0.50$$

$$0.03<Zn/(In+Ga+Zn)<0.50$$

The mixed powder is prepared such that the specific surface area of each of the raw materials is increased by 1.0 to 2.5 m$^2$/g or such that the average median diameter of each of the raw materials becomes 0.6 to 1.0 µm after pulverization and mixing/granulation.

If the specific surface area of each of the raw materials is increased by less than 1.0 m$^2$/g or the average median diameter of each of the raw materials is increased by less than 0.6 µm, the amount of impurities which are admixed from a pulverizer or the like during pulverization and mixing/granulation may be increased.

In the above-mentioned pulverization and mixing/granulation, if the specific surface areas of indium oxide and gallium oxide before pulverization and mixing/granulation are almost the same, pulverization and mixing/granulation can be performed more effectively. It is preferred that the difference in specific surface area between indium oxide and gallium oxide before pulverization and mixing/granulation be 3 m$^2$/g or less. If the difference in specific surface area is outside the above-mentioned range, pulverization and mixing/granulation cannot be performed efficiently. As a result, gallium oxide particles may remain in the resulting sintered body.

If the median diameter of indium oxide and the median diameter of gallium oxide before pulverization and mixing/granulation are almost the same, pulverization and mixing/granulation can be performed more efficiently. It is preferred that the difference in median diameter between indium oxide and gallium oxide before pulverization and mixing/granulation be 1 µm or less. If the difference in median diameter is not within this range, gallium oxide particles may remain in the resulting sintered body.

As the molding treatment for molding the above-mentioned mixture, die molding, cast molding, injection molding, and the like can be given. In order to obtain a sintered body having a high degree of density, it is preferable to mold by CIP (isostatic press) or the like.

For the molding treatment, a molding aid such as polyvinyl alcohol, methyl cellulose, polywax, oleic acid or the like may be used.

It is possible to produce a sintered body for the sputtering target of the invention by subjecting a molded product obtained by the above-mentioned method to firing.

The temperature for firing is 1250° C. or higher and lower than 1450° C., preferably 1300° C. or higher and lower than 1450° C. The firing time is normally 2 to 100 hours, preferably 4 to 40 hours.

If the firing temperature is lower than 1250° C., a resulting sintered body may not have an increased density. If the firing temperature is 1450° C. or higher, zinc is evaporated, whereby the composition of the sintered body varies and/or voids are generated in the target.

It is preferred that the above-mentioned firing be performed in an oxygen stream or under an oxygen pressure. By performing firing in an oxygen atmosphere, evaporation of zinc can be suppressed, whereby a sintered body having no voids can be produced. InGaZnO$_4$ and ZnGa$_2$O$_4$ are formed in this sintered body. Formation of InGaZnO$_4$ and ZnGa$_2$O$_4$ can be confirmed by the X-ray diffraction method.

The sputtering target of the invention can be produced by subjecting the sintered body after firing to, for example, polishing to have a desired surface roughness.

For example, the above-mentioned sintered body is ground by means of a surface grinder to allow the average surface roughness (Ra) to be 5 µm or less, preferably 2 µm or less. Furthermore, the sputtering surface is then subjected to mirror finishing, whereby the average surface roughness (Ra) can be to 1,000 angstroms or less.

There are no restrictions on the type of mirror finishing (polishing). Known polishing technologies such as mechanical polishing, chemical polishing, and mechanochemical polishing (combination of mechanical polishing and chemical polishing) can be used. For example, it is possible to polish to a roughness of #2000 or more by using a fixed abrasive polisher (polishing solution: water), or, after lapping by means of a free abrasive lap (abrasive: SiC paste or the like), it is possible to lap by using diamond paste instead of the abrasive.

In the method for producing the sputtering target of the invention, it is preferred that the resulting sputtering target be subjected to a cleaning treatment.

Examples of the cleaning treatment include air blowing and washing with running water. If cleaning (removal of foreign matters) is performed by air blowing, foreign matters can be effectively removed by absorbing the air by means of a dust collector facing the nozzle.

After the above-mentioned cleaning treatments such as air blowing and washing with running water, it is preferred that ultrasonic cleaning or the like be further conducted. It is effective to conduct this ultrasonic cleaning by generating multiple oscillation within a frequency of 25 to 300 KHz. For example, ultrasonic cleaning may be performed by generating multiple oscillation of 12 kinds of frequencies of from 25 to 300 KHz every 25 KHz.

After bonding to a backing plate, the sputtering target can be installed in a sputtering apparatus.

According to the method for producing the sputtering target of the invention, it is possible to obtain a high-density sintered body for a sputtering target without the need of a prefiring step. In addition, it is possible to obtain a sintered body with a low bulk resistance with the need of a reduction step. The sputtering target of the invention can be produced with a high degree of productivity since the production thereof does not require the above-mentioned prefiring and reduction steps.

An oxide semiconductor film can be formed by using the target of the invention. As the film forming method, the RF magnetron sputtering method, the DC magnetron sputtering method, the electron beam deposition method, the ion plating method or the like can be used. Of these, the RF magnetron sputtering method can preferably be used. If the bulk resistance of the target exceeds 1 Ωcm, a stable sputtering state can be maintained without causing abnormal discharge if the RF magnetron sputtering method is used. If the bulk resistance of the target is 10 mΩcm or less, the DC magnetron sputtering method, which is industrially advantageous, can also be used.

As a result, a stable sputtering state can be maintained without suffering from abnormal discharge, and stable film formation can be performed continuously on the industrial scale.

An oxide semiconductor film formed by using the sputtering target of the invention generates only a small amount of nodules or particles due to the high density of the sputtering target, and hence, is improved in film properties (excellent surface smoothness with no film quality disorders).

Second Invention

The sputtering target of the invention is an IGZO sputtering target which is produced mainly from indium oxide, gallium oxide and zinc oxide, comprises a compound shown by $InGaZnO_4$ as a main component and further contains a metal element with an atomic valency of positive tetravalency or higher. In an IGZO sputtering target to which a metal element with an atomic valency of positive tetravalency or higher is added, the bulk resistance of the target itself can be reduced and the occurrence of abnormal discharge during DC sputtering can be suppressed.

Furthermore, in the production process of the target, it is possible to omit a reduction step for reducing the bulk resistance of the target. Therefore, productivity can be improved with a reduced production cost.

The presence of a compound (crystal) shown by $InGaZnO_4$ as a main component means that a structure other than $InGaZnO_4$ cannot be confirmed by the X-ray diffraction analysis, or means that, even though a structure other than $InGaZnO_4$ is confirmed, the intensity thereof is smaller than that of $InGaZnO_4$.

In the sputtering target of the invention, the amount (weight) of the metal element with an atomic valency of positive tetravalency or higher relative to the total metal elements in the target is preferably 100 ppm to 10000 ppm. If the amount is less than 100 ppm, the effects of adding a metal element with an atomic valency of positive tetravalency or higher may be small, and if the amount exceeds 10000 ppm, an oxide thin film may have an insufficient stability or may have a lowered carrier mobility. The amount of a metal element with an atomic valency of positive tetravalency or higher is preferably 200 ppm to 5000 ppm, more preferably 500 ppm to 2000 ppm.

In the sputtering target of the invention, it is preferred that the bulk resistance of the target be less than $1 \times 10^{-3}$ Ωcm. If the bulk resistance is $1 \times 10^{-3}$ Ωcm or more, when DC sputtering is conducted for a long period of time, spark is generated due to abnormal discharge to cause the target to be cracked or the properties of the resulting film as an oxide semiconductor film may be lowered due to the adhesion of] particles which have jumped out from the target by spark to a formed film on a substrate.

The bulk resistance is a value which is measured by means of a resistivity meter according to the four probe method.

The sputtering target of the invention can be produced by mixing all powder of indium oxide, gallium oxide, zinc oxide and a material containing a metal element with an atomic valency of positive tetravalency or higher to form a mixture and pulverizing and sintering the mixture.

As the raw material containing a metal element with an atomic valency of positive tetravalency or higher, a simple metal element or a metal oxide can be used. As the metal element with an atomic valency of positive tetravalency or higher, one or a plurality of metal elements may be appropriately selected from tin, zirconium, germanium, cerium, niobium, tantalum, molybdenum and tungsten.

As for the raw material powder, it is preferred that the specific surface area of the indium oxide powder be 8 to 10 m²/g, the specific surface area of the gallium oxide powder be 5 to 10 m²/g, and the specific surface area of the zinc oxide powder be 2 to 4 m²/g. It is preferred that the median diameter of the indium oxide powder be 1 to 2 μm, the median diameter of the gallium oxide powder be 1 to 2 μm and the median diameter of the zinc oxide powder be 0.8 to 1.6 μm.

Furthermore, it is preferable to use powder in which the specific surface area of the indium oxide powder and the specific surface area of the gallium oxide powder are almost the same. By using such powder, pulverization and mixing can be conducted more efficiently. Specifically, it is preferable to make a specific surface area difference 3 m²/g or less. If the specific surface area is significantly different between the indium oxide powder and the gallium oxide powder, pulverization and mixing may not be conducted efficiently, and as a result, gallium oxide particles may remain in the resulting sintered body.

In the raw material powder, the indium oxide powder, the gallium oxide powder and the zinc oxide powder are mixed such that the mixing ratio thereof (indium oxide powder: gallium oxide powder: zinc oxide powder) becomes about 45:30:25 (In:Ga:Zn=1:1:1 in molar ratio) or about 51:34:15 ($In_2O_3:Ga_2O_3:ZnO$=1:1:1).

It is preferred that the amount of the material containing the metal element with an atomic valency of positive tetravalency or higher be 100 ppm to 10000 ppm relative to the total metal elements in the target. The amount of the material containing the metal element with an atomic valency of positive tetravalency or higher is appropriately adjusted based on the amounts of the indium oxide powder, the gallium oxide powder and the zinc oxide powder.

As long as the mixed powder containing the indium oxide powder, the gallium oxide powder, the zinc oxide powder and the material containing a metal element with an atomic valency of positive tetravalency or higher is used, other components for improving the properties of the sputtering target may be added.

The mixed powder is pulverized by means of a wet medium stirring mill, for example. At this time, it is preferred that pulverization be performed such that the specific area of the mixed powder is increased by 1.5 to 2.5 $m^2/g$ after pulverization, or such that the average median diameter becomes 0.6 to 1 μm after pulverization. By using the thus adjusted raw material powder, it is possible to obtain a high-density sintered body for an IGZO sputtering target without conducting the prefiring step. Also, the reduction step becomes unnecessary.

If an increase in the specific area of the raw material mixed powder is less than 1.0 $m^2/g$ or if the average median diameter of the raw material mixed powder after pulverization exceeds 1 μm, the sintered density may not be sufficiently large. If an increase in the specific surface area of the raw material mixed powder exceeds 3.0 $m^2/g$ or the average median diameter after pulverization is less than 0.6 μm, the amount of contaminants (the amount of admixed impurities) from a pulverizer or the like at the time of pulverization may be increased.

Here, the specific area of each powder is a value measured by the BET method. The median diameter of particle distribution of each powder is a value measured by means of a particle size distribution meter. These values can be adjusted by pulverizing the powder by a dry pulverizing method, a wet pulverizing method or the like.

After drying the raw material after pulverization by means of a spray dryer or the like, the raw material is then molded. Molding can be conducted by a known method such as the pressure molding method and the isostatic press method.

Then, the resulting molded product is sintered to obtain a sintered body. It is preferred that sintering be performed at 1500 to 1600° C. for 2 to 20 hours. As a result, a sintered body for an IGZO sputtering target with a sintered body density of 6.0 $g/cm^3$ or more can be obtained. If the sintering temperature is lower than 1500° C., density may not be improved. If the temperature exceeds 1600° C., zinc may be evaporated, whereby the composition of a sintered body is varied or voids are generated in a sintered body due to evaporation.

It is preferred that sintering be performed in an oxygen atmosphere by circulating oxygen or under a pressure. By this sintering method, zinc evaporation can be suppressed, whereby a sintered body having no voids can be obtained.

A sintered body produced by the above-mentioned method has a density as high as 6.0 $g/cm^3$ or more. Therefore, only a small amount of nodules or particles are generated during use, and hence, an oxide semiconductor film improved in film properties can be prepared.

In the resulting sintered body, $InGaZnO_4$ is generated as a main component. Generation of $InGaZnO_4$ can be confirmed by identifying the crystal structure by the X-ray diffraction method.

A sputtering target can be obtained by subjecting the resulting sintered body to polishing, cleaning or the like as in the case of the above-mentioned first invention.

By conducting sputtering using a sputtering target after bonding, an IGZO oxide semiconductor film containing oxides of In, Ga and Zn as main components can be formed on an object such as a substrate.

An oxide thin film obtained by using the target of the invention is an amorphous film, and since the metal element with an atomic valency of tetravalency or higher which has been added does not demonstrate doping effects (effects of carrier generation), it is fully satisfactory as a film of which the electron density is reduced. Therefore, when used as an oxide semiconductor film, it exhibits a high degree of stability, and operates stably as a semiconductor due to a suppressed Vth shift.

Third Invention

In the method for producing the sputtering target of the invention, mixed powder of indium oxide powder, gallium oxide powder and zinc oxide powder, or powder containing indium oxide, gallium oxide and zinc oxide as main components is used as a raw material. One of the characteristic features of the invention is to use each raw material having a prescribed specific surface area or a specific median diameter of particle diameter distribution.

Furthermore, the method of the invention is characterized in that it comprises the step of pulverizing the above-mentioned raw material powder by means of a wet medium stirring mill to adjust the specific surface area or the median diameter of particle size distribution, the step of molding the pulverized raw material to form a molded product and the step of sintering the molded product in an oxygen atmosphere at 1250 to 1450° C.

The method (1), in which the specific surface area is adjusted, and the method (2), in which the median diameter of particle size distribution is adjusted, will be described below.
(1) Production Method in which the Specific Surface Area is Adjusted In this method, mixed powder containing the following powder (a) to (c) is used as the raw material powder.
(a) Indium oxide powder with a specific surface area of 6 to 10 $m^2/g$
(b) Gallium oxide powder with a specific surface area of 5 to 10 $m^2/g$
(c) Zinc oxide powder with a specific surface area of 2 to 4 $m^2/g$ As mentioned later, in addition to the components (a) to (c), a fourth component may be added.

In this case, it is preferred that the total amount of the three kinds of powder accounts for 90 wt % or more of the amount of entire raw material.

The specific surface area of the entire raw material mixed powder is 5 to 8 $m^2/g$.

By allowing the specific surface area of each oxide to be within the above-mentioned range, mixing/pulverization can be conducted more efficiently.

The specific surface area of each raw material powder is a value measured by the BET method. The specific surface area can be adjusted by pulverizing the powder by a dry pulverizing method, a wet pulverizing method, or the like.

In the invention, it is preferred that the specific surface area of indium oxide and the specific surface area of gallium oxide be almost the same. This enables more efficient pulverization and mixing. It is preferred that the difference in specific surface area among the raw material powder be 3 $m^2/g$ or less. If the difference in specific surface area is large, effective pulverization and mixing may not be conducted, and gallium oxide powder may remain in the resulting sintered body.

The amount ratio of indium oxide and gallium oxide can be appropriately adjusted according to application or the like. In order to reduce the bulk resistance of the target and to conduct stable sputtering, the amount ratio (molar ratio) of indium oxide and gallium oxide is adjusted such that the amount of indium oxide and the amount of gallium oxide become the same or such that the amount of indium oxide is larger than the amount of gallium oxide. If the molar ratio of gallium oxide becomes larger than the molar ratio of indium oxide, abnormal discharge may be caused since excessive gallium oxide particles may be present in the target.

The amount of zinc oxide is preferably the same as or smaller than the total amount (molar ratio) of indium oxide and gallium oxide.

Specifically, it is preferred that indium oxide, gallium oxide and zinc oxide be weighed such that indium oxide:gallium oxide:zinc oxide (weight ratio) be almost 45:30:25 (In:Ga:Zn=1:1:1, molar ratio) or 50:35:15 ($In_2O_3$:$Ga_2O_3$:ZnO=1:1:1, molar ratio).

By mixing and pulverizing the above-mentioned raw material powder by means of a wet medium stirring mill, the specific surface area of the raw material powder is increased by 1.0 to 3.0 $m^2/g$ than the specific surface area of the raw material powder before pulverization. Due to such adjustment, a high-density sintered body for an IGZO sputtering target can be obtained without the need of the prefiring step.

If an increase in specific surface area after pulverization is less than 1.0 $m^2/g$, the density of a sintered body after the sintering step is not increased. If the specific surface area is increased by an amount exceeding 3.0 $m^2/g$, the amount of admixed impurities (contaminants) from a pulverizer or the like at the time of pulverization is increased. An increase in specific surface area after pulverization is preferably 1.5 to 2.5 $m^2/g$.

Here, the specific surface area of the raw material mixed powder before pulverization means the specific surface area measured in the state where each oxide powder has been mixed.

As the wet medium stirring mill, a commercially available apparatus, such as a beads mill, a ball mill, a roll mill, a planetary mill and a jet mill, can be used.

If a beads mill is used, as a pulverizing medium (beads), it is preferable to use zirconia, alumina, quartz, titania silicon nitride, stainless steel, mullite, glass beads, SiC or the like, and the particle diameter thereof is preferably about 0.1 to 2 mm.

In order to allow the specific surface area of the mixed powder to be increased by 1.0 to 3.0 $m^2/g$ than the specific surface area of the raw material mixed powder before pulverization, the treatment time, the type of beads, the particle diameter or the like may be appropriately adjusted. These conditions are required to be adjusted by means of an apparatus used.

The raw material after the above-mentioned pulverization is dried by means of a spray dryer or the like, followed by molding. The molding is performed by a known method, such as pressure molding and cold isostatic pressing.

Then, the resulting molded product is sintered to obtain a sintered body.

The sintering temperature is controlled to 1250° C. to 1450° C., preferably 1350° C. to 1450° C. By circulating oxygen or under an oxygen pressure, sintering is performed in an oxygen atmosphere. If the sintering temperature is lower than 1250° C., the density of the sintered body may not be increased. If the sintering temperature exceeds 1450° C., the composition of the sintered body may vary or voids may be generated in a sintered body due to evaporation. The sintering time is 2 to 72 hours, preferably 20 to 48 hours.

Evaporation of zinc can be suppressed by conducting sintering in an atmosphere of oxygen, whereby a sintered body having no voids can be obtained. As a result, the density of a sintered body can be 6.0 $g/cm^3$ or more.

In addition, it is possible to obtain a sintered body having a bulk resistance of less than 5 mΩcm without the reduction step. If a sintered body has a bulk resistance of 5 mΩcm or more, abnormal discharge may be induced or foreign matters (nodules) may be generated during sputtering.

(2) Production Method in which the Median Diameter is Adjusted

In this method, the mixed powder containing the following powder (a') to (c') is used.
(a') Indium oxide powder with a median diameter of particle size distribution of 1 to 2 μm
(b') Gallium oxide powder with a median diameter of particle size distribution of 1 to 2 μm
(c') Zinc oxide powder with a median diameter of particle size distribution of 0.8 to 1.6 μm In addition to the components (a) to (c), a fourth component may be added. In this case, it is preferred that the total of the three kinds of powder accounts for 90 wt % or more of the entire raw material.

The median diameter of particle size distribution of the mixed powder as a raw material is 1.0 to 1.9 μm.

By allowing the specific surface area of each oxide to be within the above-mentioned range, mixing/pulverization can be conducted more efficiently.

Here, the median diameter of particle size distribution is a value measured by means of a particle distribution meter. The median diameter can be adjusted by classification after performing dry pulverization and wet pulverization.

It is preferable to use powder in which the median diameter of indium oxide and the median diameter of gallium oxide are almost the same. As a result, mixing/pulverization can be performed more efficiency. It is preferred that the difference in median diameter among the raw material powder be 1 μm or less. If the difference in median diameter is large, efficient mixing/pulverization may not be performed, and as a result, gallium oxide particles may remain in the resulting sintered body.

The amount ratio of indium oxide and gallium oxide, and the pulverization step are the same as mentioned in (1) above.

By the pulverization step, the median diameter after pulverization becomes 0.6 to 1 μm. It is preferred that the median diameter of the raw material be changed before and after pulverization by 0.1 μm or more. By using the thus-prepared raw material powder, it is possible to obtain a high-density IGZO sputtering target without the need of the prefiring step. If the median diameter after pulverization exceeds 1 μm, the density of a sintered body does not increase. If the median diameter after pulverization is less than 0.6 μm, the amount of impurities from a pulverizer or the like during pulverization increases.

Here, the median diameter after pulverization means the median diameter of the entire mixed powder.

The raw material after pulverization is molded and sintered to produce a sintered body. The molding and sintering may be performed in the same manner as in (1) mentioned above.

The sintered body prepared in (1) or (2) as mentioned above is then subjected to polishing, cleaning or the like as in the above-mentioned first invention, whereby a sputtering target is obtained.

By conducting sputtering using a sputtering target after bonding, it is possible to obtain an oxide semiconductor film containing oxides of In, Ga and Zn as main components. According to the production method of the invention, not only the productivity of the sputtering target is improved, but also the density of the resulting sputtering target can be as high as 6.0 $g/cm^3$ or more. Therefore, an oxide semiconductor film excellent in film properties, suffering from only a small amount of nodules or particles, can be obtained. Although depending on the composition, the upper limit of the density of the sputtering target is about 6.8 $g/cm^3$.

In the invention, in order to further decrease the bulk resistance of the sputtering target, a metal element with an atomic valency of tetravalency or higher may be contained in an amount of 200 to 5000 ppm (atomic ratio) in a sintered body. Specifically, in addition to indium oxide, gallium oxide and zinc oxide, $SnO_2$, $ZrO_2$, $CeO_2$, $GeO_2$, $TiO_2$, $HfO_2$ or the like may be added.

In the production method according to the invention, as far as indium oxide, gallium oxide and zinc oxide are contained as main components, other components for improving the properties of the sputtering target may be contained in the raw material powder. For example, a lanthanoid-based element with an atomic valency of positive trivalency may be added, for example.

The resulting oxide semiconductor film is amorphous, and exhibits stable semiconductor properties with no carrier generation effects (doping effects) even though a metal element with an atomic valency of tetravalency or higher is added.

EXAMPLES

The invention will be explained by way of examples while comparing them with comparative examples. The following examples only show preferable examples, and the invention are by no ways limited by these examples. Therefore, various modifications based on the technical concept of the invention or other examples are included in the invention.

First Invention

The method for measuring the properties of the sputtering target prepared in examples and comparative examples will be shown below.

(1) Density

Density was calculated from the weight and external dimension of a target which has been cut out with a specific dimension.

(2) Bulk Resistance of Target

Bulk resistance was measured by the four probe method by means of a resistivity meter (Rhoresta, manufactured by Mitsubishi Chemical Corporation).

(3) Structure of Oxide Present in Target

The structure of an oxide was identified by analyzing a chart obtained by the X-ray diffraction method.

(4) Specific Surface Area of Raw Material Powder

The specific surface area of the raw material powder was measured by the BET method.

(5) Median Diameter of Raw Material Powder

The median diameter of the raw material powder was measured by means of a particle size distribution measuring apparatus.

(6) Average Transverse Rupture Strength

The average transverse rupture strength was measured by the three-point bending test.

(7) Weibull Modulus of Sputtering Target

By the median rank method, the cumulative probability of failure against the bending strength and the Weibull plot in the single mode were obtained, whereby a Weibull modulus (m value) showing the variation of probability of failure was obtained. The Weibull modulus (m value) was obtained by using the linear regressive line.

Example 1

99.99%-pure indium oxide powder with a specific surface area of 6 $m^2/g$, 99.99%-pure gallium oxide powder with a specific surface area of 6 $m^2/g$, and 99.99%-pure zinc oxide powder with a specific surface area of 3 $m^2/g$ were weighed such that the weight ratio of $In_2O_3:Ga_2O_3:ZnO$ became 45:30:25. The powder was then subjected to mixing/pulverization by means of a wet medium stirring mill. As the medium of the wet medium stirring mill, zirconia beads with a diameter of 1 mm were used.

After the mixing/pulverization, the specific surface area of each raw material powder was increased by 2 $m^2/g$. The raw material powder was then dried by means of a spray dryer. The resulting mixed powder was placed in a mold, and then subject to pressure molding by means of a cold pressing machine, whereby a molded product was produced.

The resulting molded product was sintered for 4 hours at a high temperature of 1400° C. in an oxygen atmosphere by circulating oxygen. As a result, a sintered body for an IGZO sputtering target (sputtering target) having a density of 6.06 $g/cm^3$ was obtained without conducting the prefiring step. The X-ray diffraction analysis confirmed the presence of crystals of $ZnGa_2O_4$ and $InGaZnO_4$ in the sintered body. FIG. 1 shows an X-ray diffraction analysis chart.

The sintered body had a bulk resistance of 4.2 mΩcm.

The amount of impurities in this sintered body was measured by the ICP analysis. The results showed that the content of each of Fe, Al, Si, Ni and Cu was less than 10 ppm.

Example 2

Indium oxide powder with a median diameter of 1.5 μm, gallium oxide powder with a median diameter of 2.0 μm, and zinc oxide powder with a median diameter of 1.0 μm were weighed such that the weight ratio of $In_2O_3:Ga_2O_3:ZnO$ became almost 55:25:20. The powder was then subjected to mixing/pulverization by means of a wet medium stirring mill. As the medium of the wet medium stirring mill, zirconia beads with a diameter of 1 mm were used.

After the mixing/pulverization, the average median diameter of each raw material was allowed to be 0.8 μm. The raw material powder was then dried by means of a spray dryer. The resulting mixed powder was placed in a mold, and then subject to pressure molding by means of a cold pressing machine, whereby a molded product was produced.

Figure 2:
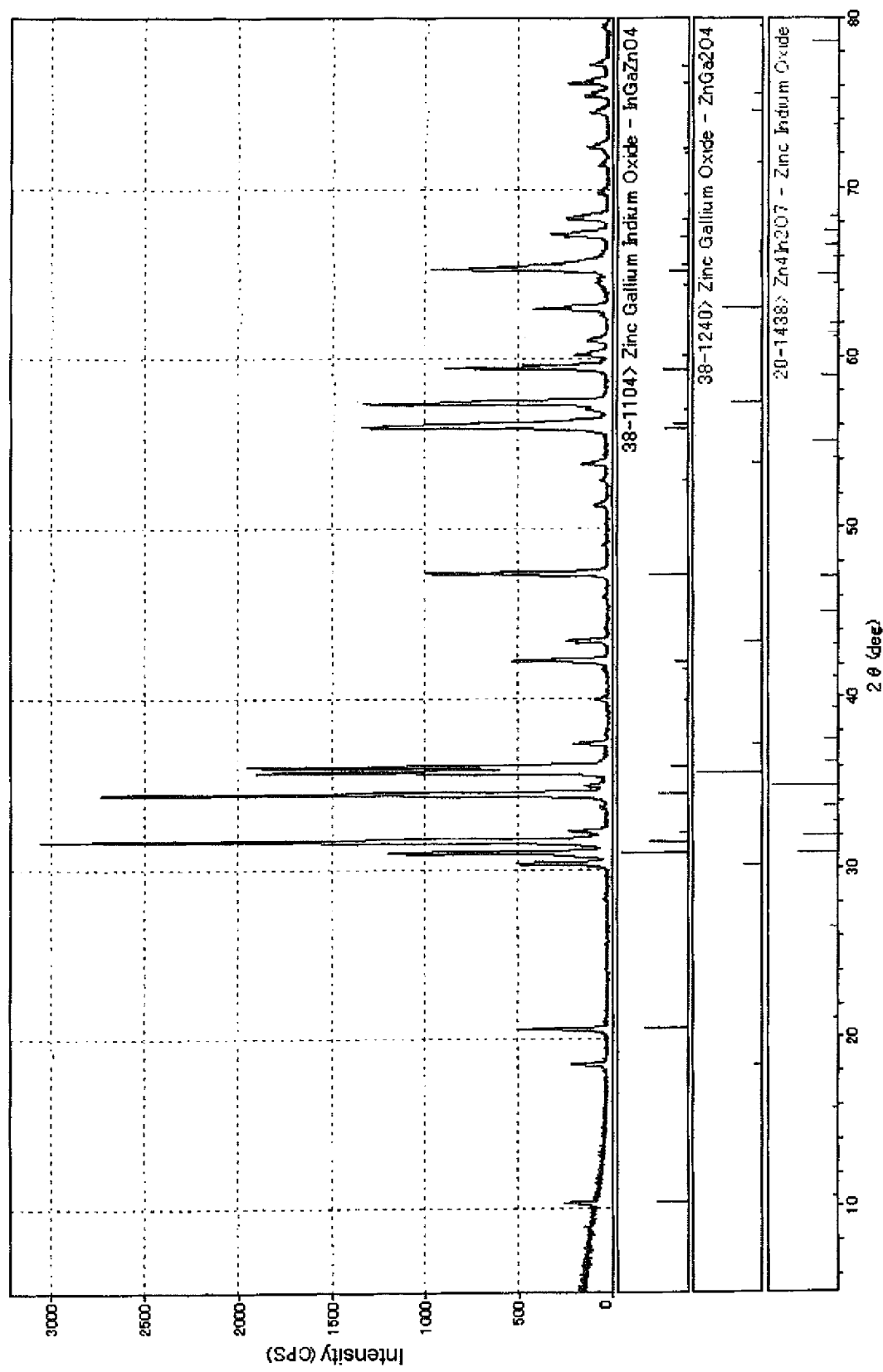
FIG. 2 is an X-ray chart of a target prepared in Example 2.

The resulting molded product was sintered for 4 hours at a high temperature of 1400° C. in an oxygen atmosphere by circulating oxygen. As a result, a sintered body for an IGZO sputtering target having a density of 6.14 $g/cm^3$ was obtained without conducting the prefiring step. The X-ray diffraction analysis confirmed the presence of crystals of $ZnGa_2O_4$, $InGaZnO_4$ and $In_2O_3(ZnO)_4$ in the sintered body. FIG. 2 shows the X-ray diffraction analysis chart.

The sintered body had a bulk resistance of 3.8 mΩcm.

Example 3

Indium oxide powder with a median diameter of 1.5 μm, gallium oxide powder with a median diameter of 2.0 μm, and zinc oxide powder with a median diameter of 1.0 μm were weighed such that the weight ratio of $In_2O_3:Ga_2O_3:ZnO$ became almost 35:25:40. The powder was then subjected to mixing/pulverization by means of a wet medium stirring mill. As the medium of the wet medium stirring mill, zirconia beads with a diameter of 1 mm were used.

After the mixing/pulverization, the average median diameter of each raw material was 0.8 μm. The raw material powder was then dried by means of a spray dryer. The resulting mixed powder was placed in a mold, and then subject to pressure molding by means of a cold pressing machine, whereby a molded product was produced.

Figure 3:
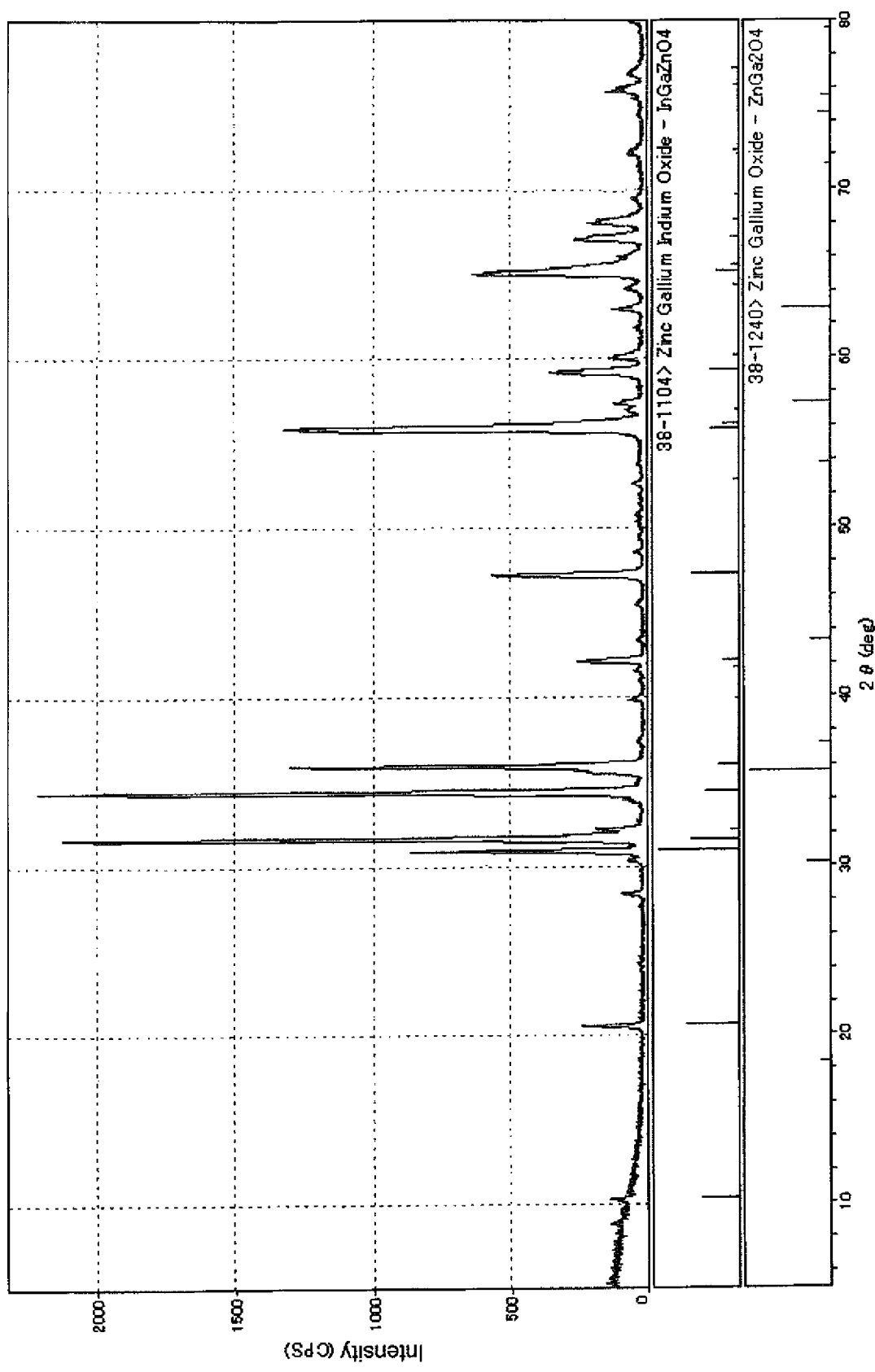
FIG. 3 is an X-ray chart of a target prepared in Example 3.

The resulting molded product was sintered for 4 hours at a high temperature of 1400° C. in an oxygen atmosphere by circulating oxygen. As a result, a sintered body for an IGZO sputtering target having a density of 6.02 g/cm$^3$ was obtained without conducting the prefiring step. The X-ray diffraction analysis confirmed that crystals of $ZnGa_2O_4$ and $InGaZnO_4$ were present in the sintered body. FIG. 3 shows an X-ray diffraction analysis chart.

The sintered body had a bulk resistance of 4.9 mΩcm.

Comparative Example 1

Indium oxide powder with a median diameter of 1.5 µm, gallium oxide powder with a median diameter of 2.0 µm, and zinc oxide powder with a median diameter of 1.0 µm were weighed such that the weight ratio of $In_2O_3:Ga_2O_3:ZnO$ became almost 34:46:20. The powder was then subjected to mixing/pulverization by means of a wet medium stirring mill. As the medium of the wet medium stirring mill, zirconia beads with a diameter of 1 mm were used.

After the mixing/pulverization, the average median diameter of each raw material was allowed to be 0.8 µm. The raw material powder was then dried by means of a spray dryer. The resulting mixed powder was placed in a mold, and then subject to pressure molding by means of a cold pressing machine, whereby a molded product was produced.

Figure 4:
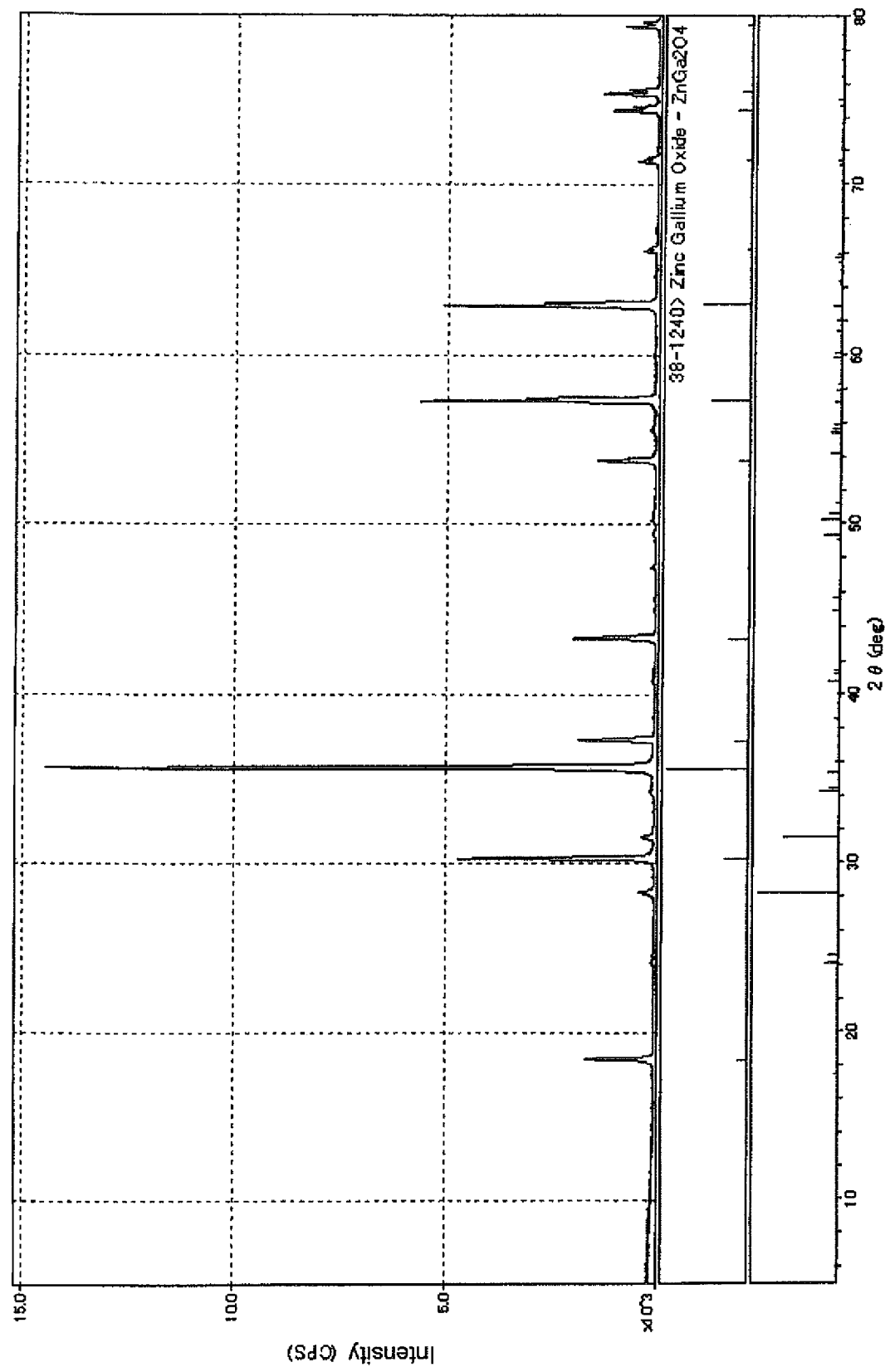
FIG. 4 is an X-ray chart of a target prepared in Comparative Example 1.

The resulting molded product was sintered for 4 hours at a high temperature of 1200° C. in an oxygen atmosphere by circulating oxygen. As a result, a sintered body for an IGZO sputtering target having a density of 5.85 g/cm$^3$ was obtained without conducting the prefiring step. As a result of the X-ray diffraction analysis, it was confirmed that, although crystals of $ZnGa_2O_4$ were present in the sintered body, $InGaO_3(ZnO)_m$ was not generated. FIG. 4 shows an X-ray diffraction analysis chart.

The sintered body had a bulk resistance of 450 mΩcm.

Examples 4 and 5

Then, the sintered body for an IGZO sputtering target produced in Example 1 was subjected to fine polishing (Example 4: fine polishing, Example 5: surface grinding in the longitudinal direction), whereby a sputtering target was produced. As for the structure of the thus-produced sputtering target, the target surface was analyzed by observing a secondary electron image of a scanning electron microscope (SEM). As a result, the average particle diameters of $ZnGa_2O_4$ crystals in the targets in Examples 4 and 5 were found to be 4.4 µm. The surface roughness was measured by means of a surface roughness meter. As a result, it was found that the surface roughness Ra of the target in Example 4 was 0.5 µm and the surface roughness Ra of the target in Example 5 was 1.8 µm.

Comparative Example 2

The sintered body for an IGZO sputtering target produced in Comparative Example 1 was subjected to fine polishing (surface grinding in the longitudinal direction), whereby a sputtering target was produced. As for the structure of the thus produced sputtering target, the target surface was analyzed by observing a secondary electron image of a scanning electron microscope (SEM). The average particle diameter of $ZnGa_2O_4$ crystals in the target was 14 µm. The surface roughness was measured by means of a surface roughness meter. As a result, it was found that the surface roughness Ra of the target was 3.5 µm.

Then, as for each of the sputtering targets obtained in Examples 4 and 5, and Comparative Example 2, the Weibull modulus and the average transverse rupture strength were evaluated. The results are shown in Table 1.

TABLE 1

| | Grinding condition | Surface roughness Ra (µm) | Weibull modulus [—] | Average transverse rupture strength [MPa] |
|---|---|---|---|---|
| Example 4 | Polishing | 0.5 | 10.4 | 58 |
| Example 5 | Surface grinding in the longitudinal direction | 1.8 | 10.2 | 54 |
| Comparative Example 2 | Surface grinding in the longitudinal direction | 3.5 | 9.1 | 46 |

A larger Weibull modulus value means that no variation can be observed in the maximum value of the non-destructive stress. From the results shown in Table 1, it was confirmed that the sputtering target of the invention was a stable target suffering from only a small degree of variation.

The surface roughness after surface grinding normally corresponds to the particle diameter of the crystals. If the particle diameter is not uniform, Ra tends to increase. The transverse rupture strength is lowered with an increase in Ra.

From the results shown in Table 1, it was confirmed that the sputtering target of the invention has a high quality since it has a small crystal particle diameter and a small surface roughness.

Example 6

The target produced in Example 4 (diameter: 4 inches, thickness: 5 mm) was bonded to a backing plate, and then installed in a DC sputtering film formation apparatus. Under an argon atmosphere of 0.3 Pa, continuous sputtering was conducted at 100 W for 100 hours. Nodules generated on the target surface were observed. As a result of the observation, no nodules were generated on the surface.

Comparative Example 3

The target produced in Comparative Example 2 (diameter: 4 inches, thickness: 5 mm) was bonded to a backing plate, and then installed in a DC sputtering film formation apparatus. Under an argon atmosphere of 0.3 Pa, continuous sputtering was conducted at 100 W for 100 hours. Nodules generated on the target surface were observed. It was found that nodules were generated on almost half of the target surface.

Example 7

Figure 5:
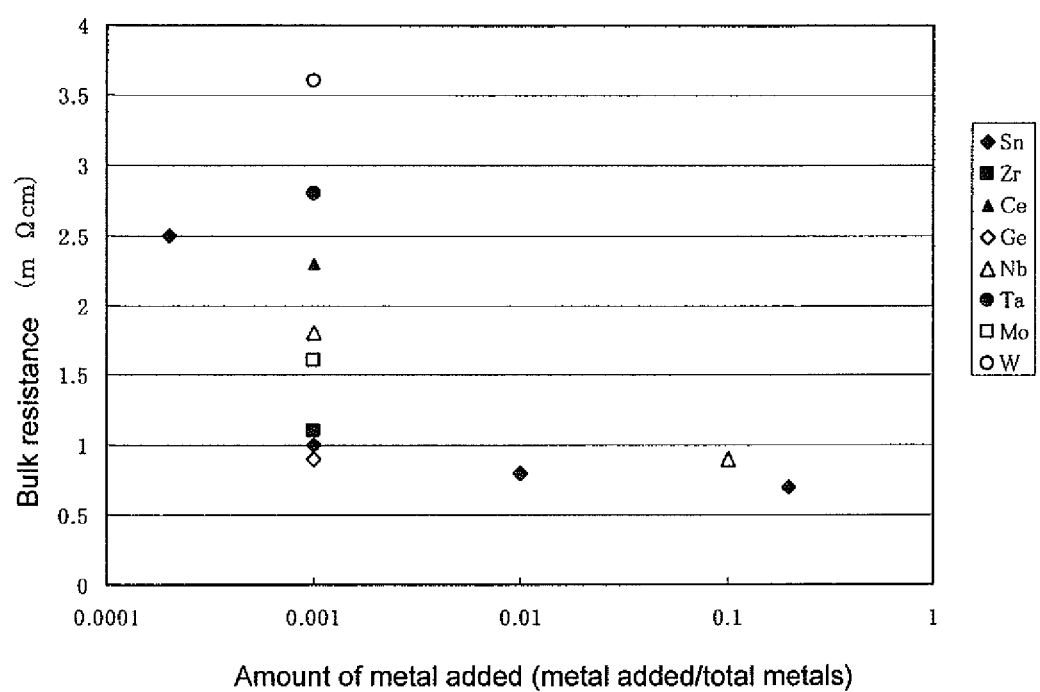
FIG. 5 is a graph showing the relationship between the amount of a metal with an atomic valency of positive tetravalency or higher and the bulk resistance of a sintered body.
Figure 6:
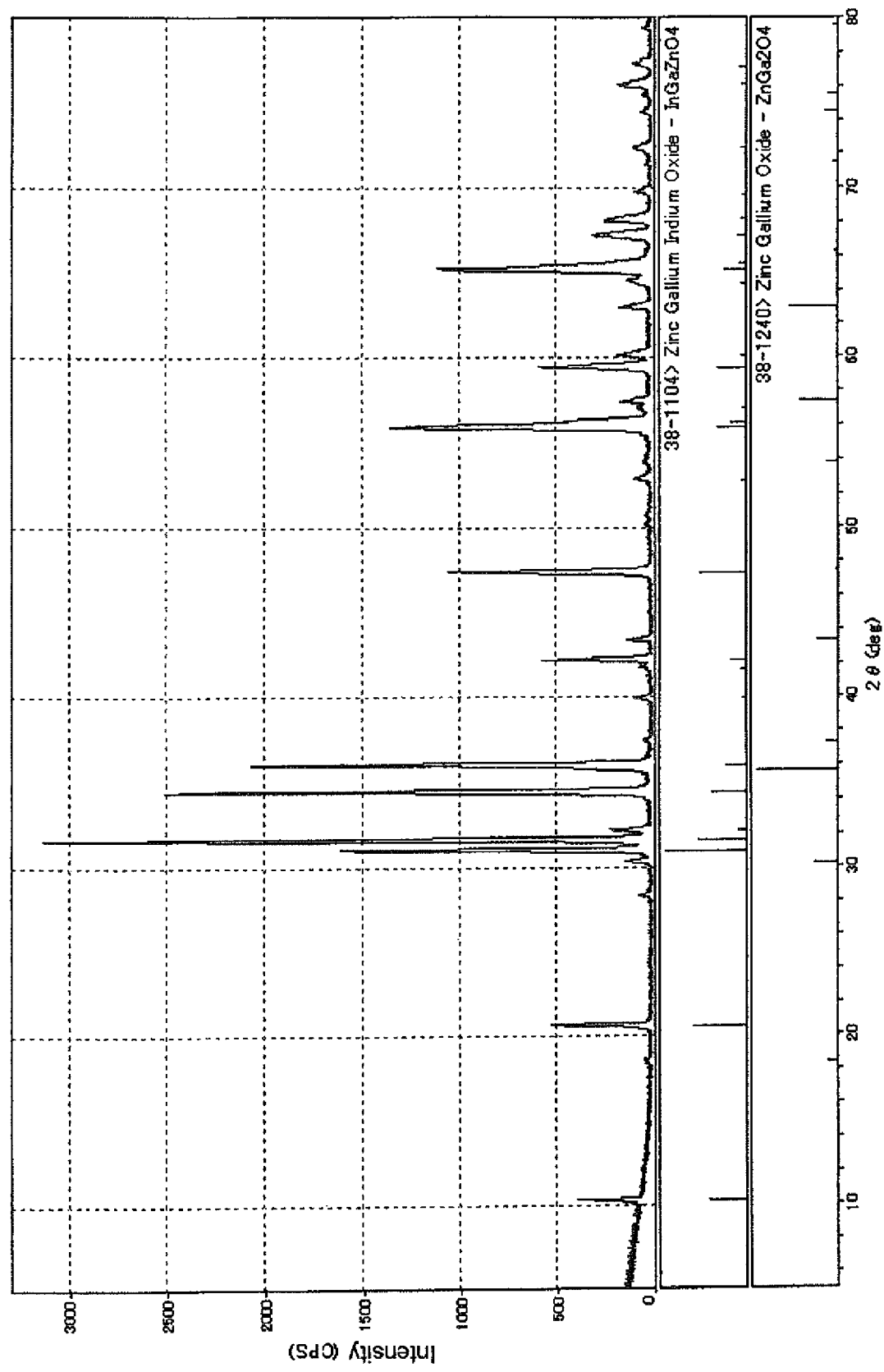
FIG. 6 is an X-ray diffraction chart of a target prepared by adding tin.

A sintered body was prepared in the same manner as in Example 1, except that tin oxide, zirconium oxide, germanium oxide, cerium oxide, niobium oxide, tantalum oxide, molybdenum oxide or tungsten oxide (an oxide of a metal element with an atomic valency of positive tetravalency or higher) was added. The bulk resistance of the sintered body was measured. The relationship between the amount of a metal element with an atomic valency of positive tetravalency or higher and the bulk resistance of the sintered body is shown in FIG. 5. A sintered body for an IGZO sputtering target was obtained by using tin as the metal element with an atomic valency of positive tetravalency or higher and by adding tin such that [tin element/total metal elements: atomic ratio] became 0.001. The X-ray diffraction chart of the resulting sintered body for an IGZO sputtering target is shown in FIG. 6.

As is apparent from FIG. 5, by adding a metal element with an atomic valency of positive tetravalency or higher, the bulk resistance was lowered.

Second Invention

Example 8

Indium oxide powder with a specific surface area of 6 m$^2$/g, gallium oxide powder with a specific surface area of 6 m$^2$/g, and zinc oxide powder with a specific surface area of 3 m$^2$/g were weighed such that the weight ratio became 45:30:25. Furthermore, as the metal element with an atomic valency of positive tetravalency or higher, $SnO_2$ was added such that the content of an Sn element relative to the total metal elements [Sn/(In+Ga+Zn+Sn): weight ratio] became 600 ppm.

The raw material mixed powder was subjected to mixing/pulverization by means of a wet medium stirring mill. As the medium, zirconia beads with a diameter of 1 mm were used. After the mixing/pulverization, the specific surface area of the raw material powder was increased by 2 m$^2$/g. The raw material powder was then dried by means of a spray dryer.

The resulting mixed powder was placed in a mold, and then subject to pressure molding by means of a cold pressing machine, whereby a molded product was produced. The resulting molded product was sintered at 1550° C. for 8 hours in an oxygen atmosphere by circulating oxygen. As a result, a sintered body for an IGZO sputtering target having a density of 6.12 g/cm$^3$ was obtained without conducting the prefiring step.

The density of the sintered body was calculated from the weight and the external dimension of a sintered body which had been cut out into a specific size.

Figure 7:
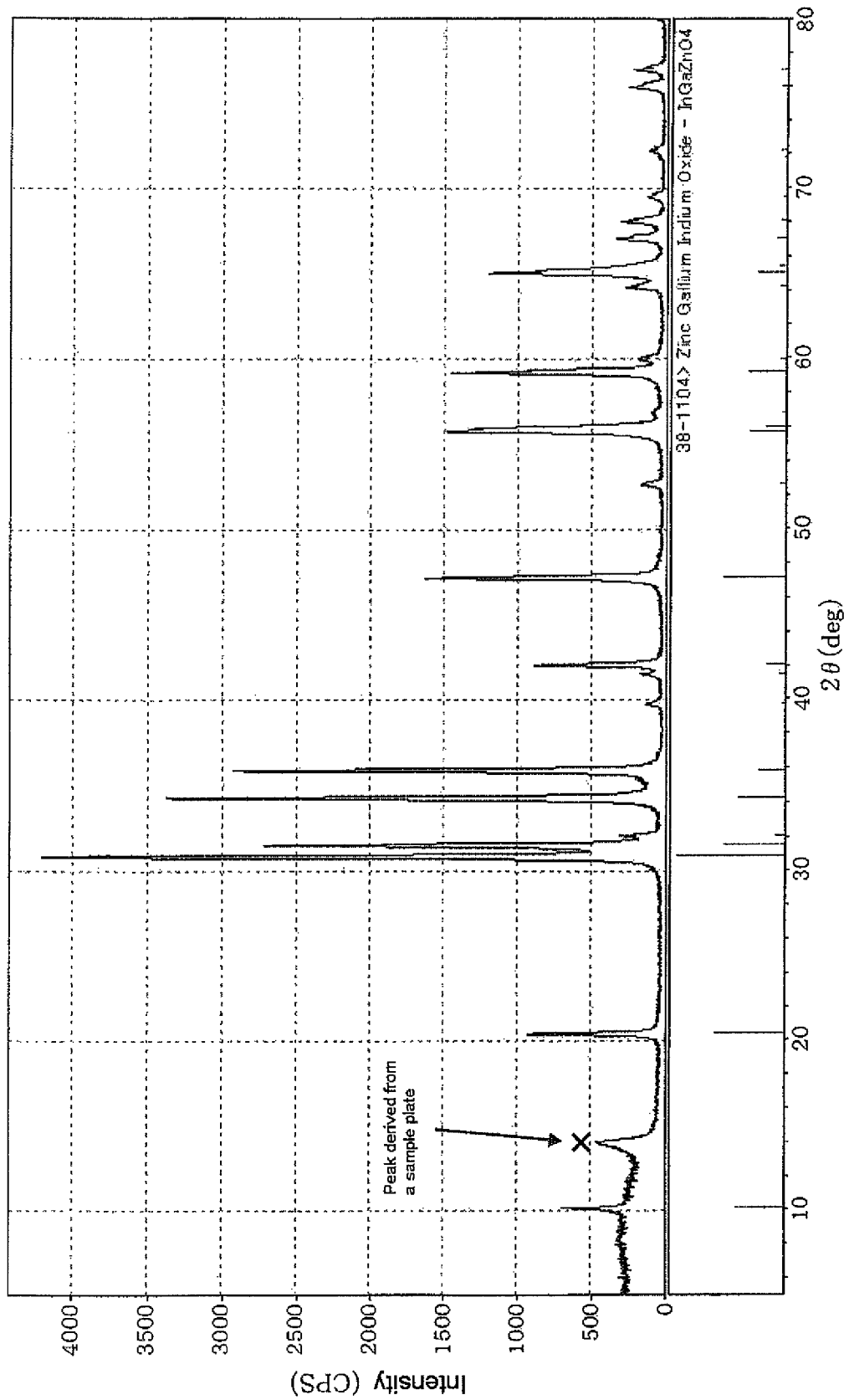
FIG. 7 is an X-ray diffraction chart of a sintered body prepared in Example 8.

The sintered body was analyzed by the X-ray diffraction method. FIG. 7 is an X-ray diffraction chart of the sintered body. From FIG. 7, presence of crystals of $InGaZnO_4$ could be confirmed. Since a peak derived from a metal oxide other than $InGaZnO_4$ could not be observed, it was confirmed that a sintered body containing $InGaZnO_4$ as main components was obtained.

The bulk resistance of the thus obtained sintered body was measured by the four probe method by means of a resistivity meter (Rhoresta, manufactured by Mitsubishi Chemical Corporation). It was found that the bulk resistance was 0.95×10$^{-3}$ Ωcm.

Comparative Example 4

A sintered body was produced in the same manner as in Example 8, except that a metal oxide which contained a metal element with an atomic valency of positive tetravalency or higher (tin oxide) was not added.

The density of this sintered body was found to be 5.98 g/cm$^3$. As a result of the X-ray diffraction analysis, it was confirmed that a sintered body containing $InGaZnO_4$ as a main component was obtained, since crystals of $InGaZnO_4$ were present and a peak derived from a metal oxide other than $InGaZnO_4$ was not observed.

The bulk resistance of this sintered body was 0.018 Ωcm.

Figure 8:
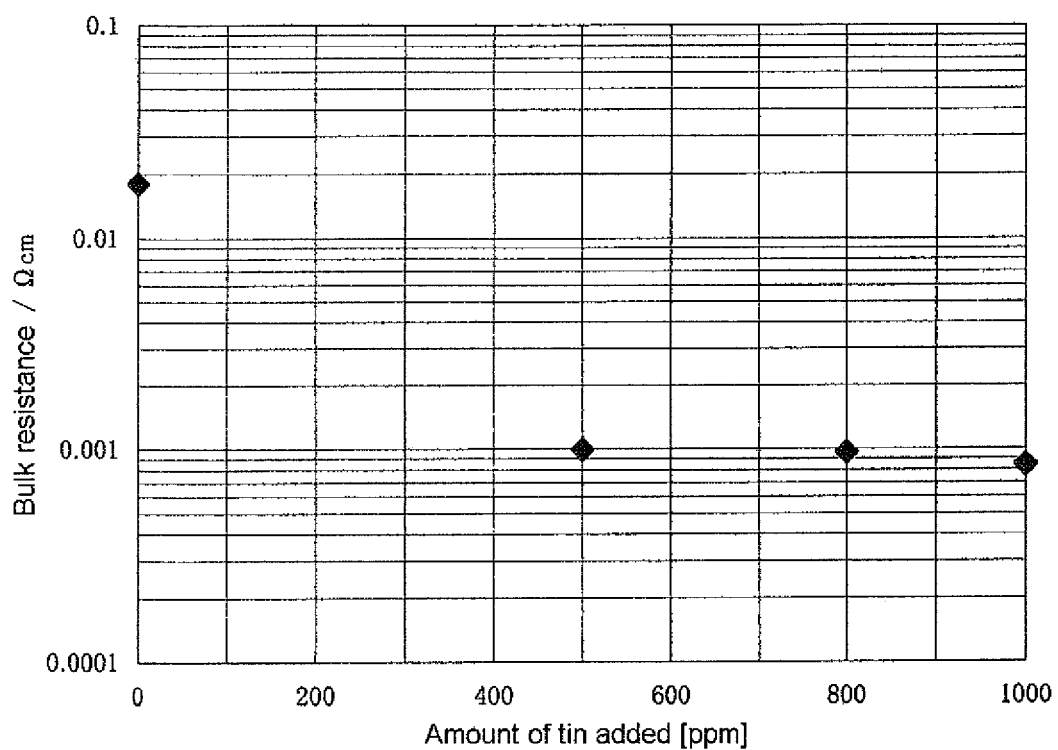
FIG. 8 is a graph showing the relationship between the amount of a tin element and the bulk resistance of a sintered body.

FIG. 8 is a graph showing the relationship between the amount of a tin element and the bulk resistance of the sintered body. FIG. 8 shows the bulk resistances of sintered bodies prepared in the same manner as in Example 8 except that the amount of the tin oxide powder was varied to 500 ppm, 800 ppm and 1000 ppm and the bulk resistance of a sintered body prepared in Comparative Example 4 (the amount of a tin element was 0 ppm). As is apparent from FIG. 8, by adding a tin element which is a metal element with an atomic valency of tetravalency or higher, the bulk resistance of a sintered body could be reduced.

Examples 9 to 15

Sintered bodies were prepared in the same manner as in Example 8, except that, as the metal oxide containing a metal element with an atomic valency of tetravalency or higher, a prescribed amount of an oxide shown in Table 2 was used instead of tin oxide. The bulk resistances of the sintered body are shown in Table 2.

TABLE 2

| | Metal oxide | Amount added (weight ppm) | Bulk resistance (Ω cm) |
|---|---|---|---|
| Example 9 | Zirconium oxide | 1010 | 0.94 × 10$^{-3}$ |
| Example 10 | Germanium oxide | 1020 | 0.89 × 10$^{-3}$ |
| Example 11 | Cerium oxide | 2000 | 0.92 × 10$^{-3}$ |
| Example 12 | Niobium oxide | 5000 | 0.95 × 10$^{-3}$ |
| Example 13 | Tantalum oxide | 10000 | 0.96 × 10$^{-3}$ |
| Example 14 | Molybdenum oxide | 1500 | 0.92 × 10$^{-3}$ |
| Example 15 | Tungsten oxide | 1020 | 0.91 × 10$^{-3}$ |

Figure 9:
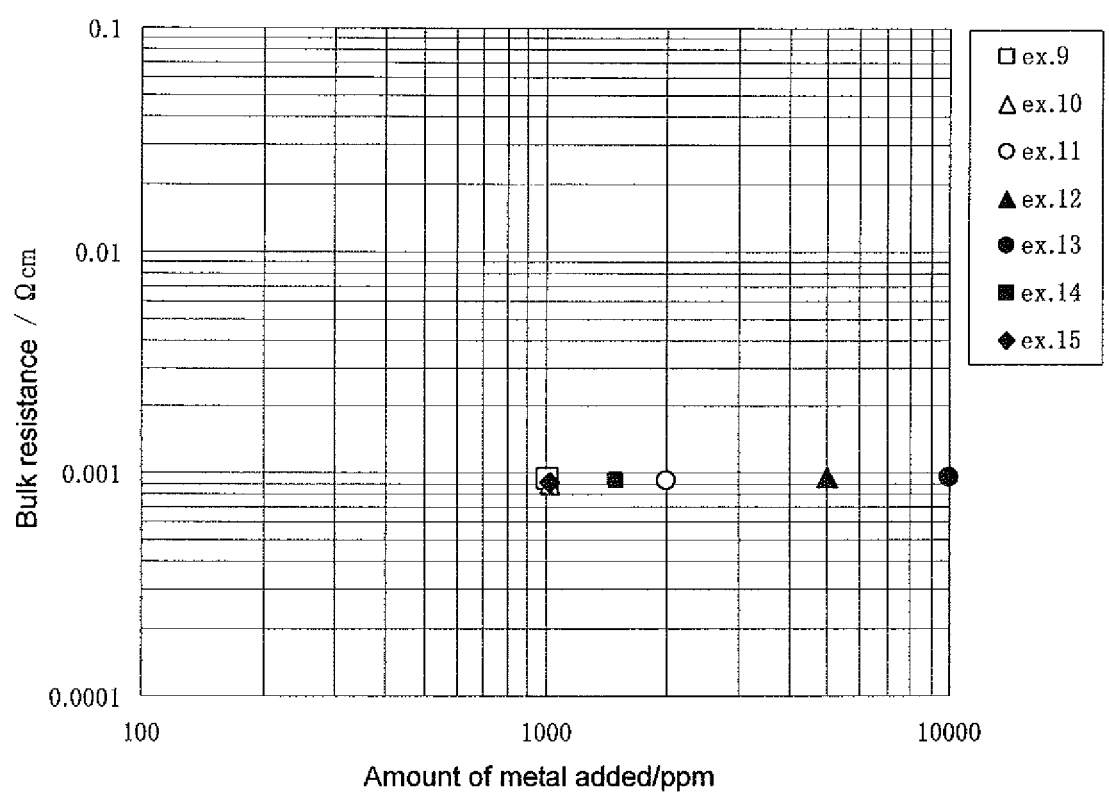
FIG. 9 is a graph showing the relationship between the amount of a metal element with an atomic valency of positive tetravalency or higher and the bulk resistance of a sintered body.

FIG. 9 shows the results of Examples 9 to 15, specifically, it is a graph showing the relationship between the amount of the metal element with an atomic valency of positive tetravalency or higher and the bulk resistance of the sintered body. As is apparent from FIG. 9, the bulk resistance is lowered by adding a metal element with an atomic valency of positive tetravalency or higher.

Third Invention

Example 16

The following oxide powder was used and weighed as the raw material mixed powder. The specific surface area was measured by the BET method.
(a) Indium oxide powder: 45 wt %, specific surface area: 6 m$^2$/g
(b) Gallium oxide powder: 30 wt %, specific surface area: 6 m$^2$/g
(c) Zinc oxide powder: 25 wt %, specific surface area: 3 m$^2$/g The specific surface area of the entire mix powder comprising (a) to (c) was 5.3 m$^2$/g.

The above-mentioned mixed powder was subjected to mixing/pulverization by means of a wet medium stirring mill. As the medium of the wet medium stirring mill, zirconia beads with a diameter of 1 mm were used. During the pulverization, the specific surface area of the mixed powder was checked, thereby to allow the specific surface area to increase by 2 m²/g.

The raw material powder was then dried by means of a spray dryer. The resulting mixed powder was placed in a mold (diameter: 150 mm, thickness: 20 mm), and then subject to pressure molding by means of a cold pressing machine.

After the molding, the resulting molded product was sintered for 40 hours at 1400° C. in an oxygen atmosphere by circulating oxygen.

The density of the thus produced sintered body was calculated from the weight and external dimension of a piece of the sintered body which had been cut out into a predetermined size. The results showed that the density of the sintered body was 6.15 g/cm³. As mentioned hereinabove, a high-density sintered body for an IGZO sputtering target could be obtained without conducting the prefiring step.

As a result of the analysis on the chart obtained by the X-ray diffraction method, it was confirmed that crystals of $InGaZnO_4$ and crystals of $Ga_2ZnO_4$ were present in the sintered body.

The bulk resistance of the sintered body was measured by means of a resistivity meter (Rhoresta, manufactured by Mitsubishi Chemical Corporation). It was found that the sintered body had a bulk resistance of 4.2 mΩcm.

Example 17

As the raw material mixed powder, the following oxide powder was used and weighed. The median diameter was measured by means of a particle size distribution meter.
(a') Indium oxide powder: 50 wt %, median diameter: 1.5 μm
(b') Gallium oxide powder: 35 wt %, median diameter: 2.0 μm
(c') Zinc oxide powder: 15 wt %, median diameter: 1.0 μm The median diameter of the entire mixed powder comprising (a') to (c') was 1.6 μm.

In the same manner as in Example 16, the above-mentioned mixed powder was subjected to mixing/pulverization by means of a wet medium stirring mill. During the pulverization, the median diameter of the mixed powder was checked, thereby to allow the median diameter to be 0.9 μm.

In the same manner as in Example 16, the mixed powder was molded, followed by sintering to produce a sintered body, and the resulting sintered body was evaluated.

The results showed that the density of the sintered body was 6.05 g/cm³. A high-density sintered body for an IGZO sputtering target could be obtained without conducting the prefiring step.

It was confirmed that crystals of $InGaZnO_4$ and crystals of $Ga_2ZnO_4$ were present in the sintered body.

The bulk resistance of the sintered body was 3.8 mΩcm.

Comparative Example 5

The following oxide powder was used and weighed as the raw material mixed powder.
(a) Indium oxide powder: 45 wt %, specific surface area: 9 m²/g
(b) Gallium oxide powder: 30 wt %, specific surface area: 4 m²/g
(c) Zinc oxide powder: 25 wt %, specific surface area: 3 m²/g The specific surface area of the entire mixed powder comprising (a) to (c) was 6 m²/g.

The raw material mixed powder was subjected to mixing/pulverization by means of a wet medium stirring mill in the same manner as in Example 16. During pulverization, the specific surface area of the mixed powder was checked, thereby to allow the specific area of the mixed powder to be increased by 1.4 m²/g.

Then, molding of the mixed powder and sintering were conducted in the same manner as in Example 16, except that the sintering condition was changed to 40 hours at 1400° C. under atmospheric conditions.

The density of the resulting sintered body was 5.76 g/cm³. That is, in this comparative example, a sintered body having a low density was obtained.

In addition, the bulk resistance of the sintered body was 140 mΩcm due to the absence of the reduction step.

In the sintered body, crystals which appeared to be gallium oxide were present.

Comparative Example 6

As the raw material mixed powder, the following oxide powder was used and weighed.
(a') Indium oxide powder: 50 wt %, median diameter: 2.5 μm
(b') Gallium oxide powder: 35 wt %, median diameter: 2.5 μm
(c') Zinc oxide powder: 15 wt %, median diameter: 2.0 μm The median diameter of the entire mixed powder comprising (a') to (c') was 2.4 μm.

In the same manner as in Example 16, the above-mentioned mixed powder was subjected to mixing/pulverization by means of a wet medium stirring mill. During the pulverization, the median diameter of the mixed powder was checked, there by to allow the median diameter to be 2.1 μm.

In the same manner as in Example 16, the mixed powder was molded, following by sintering to produce a sintered body, and the resulting sintered body was evaluated, except that the sintering condition was changed to 10 hours at 1400° C. under atmospheric conditions.

The density of the resulting sintered body was 5.85 g/cm³. That is, in this comparative example, a sintered body having a low density was obtained.

In addition, the bulk resistance of the sintered body was 160 mΩcm due to the absence of the reduction step.

In the sintered body, crystals which appeared to be gallium oxide were present.

Comparative Example 7

A prefiring step was conducted in Comparative Example 5. Specifically, the same mixed powder as in Comparative Example 5 was prefired at 1200° C. for 10 hours. The powder after the prefiring had a specific surface area of 2 m²/g.

The thus prefired powder was pulverized by means of a wet medium stirring mill, whereby the specific surface area thereof was increased by 2 m²/g. Then, the mixed powder was subjected to drying and pressure molding in the same manner as in Example 16. Thereafter, the molded product was sintered at 1450° C. for 4 hours in an oxygen atmosphere, whereby a sintered body was produced.

The sintered body had a density of 5.83 g/cm³. As compared with Comparative Example 5, the density could be increased. However, as compared with Examples 16 and 17, in which the prefiring step was not conducted, poorer results were obtained. In addition, provision of the prefiring step impaired the productivity of a sintered body.

This sintered body was subjected to a reduction treatment at 500° C. for 5 hours in a nitrogen stream. As a result, the bulk density of the sintered body was 23 mΩcm.

Comparative Example 8

The same mixed powder as in Comparative Example 6 was prefired at 1200° C. for 10 hours. The specific surface area of the prefired powder was 2 m²/g.

The prefired powder was pulverized by means of a wet medium stirring mill to increase the specific surface area by 2 m²/g. Then, the mixed powder was subjected to drying and pressure molding in the same manner as in Example 16. Thereafter, the molded product was sintered at 1450° C. for 40 hours in an oxygen atmosphere, whereby a sintered body was produced.

The sintered body had a density of 5.94 g/cm³. As compared with Comparative Example 6, the density could be increased. However, as compared with Examples 16 and 17, in which the prefiring step was not conducted, poorer results were obtained. In addition, provision of the prefiring step impaired the productivity of a sintered body.

This sintered body was subjected to a reduction treatment at 500° C. for 5 hours in a nitrogen stream. The bulk density of the sintered body was 23 mΩcm.

INDUSTRIAL APPLICABILITY

The target of the invention is suitable as a target to obtain, by the sputtering method, a transparent conductive film and an oxide semiconductor film for various applications including a transparent conductive film for a liquid crystal display (LCD) apparatus, a transparent conductive film for an electroluminescence (EL) display apparatus and a transparent conductive film for a solar cell. For example, it is possible to obtain a transparent conductive film for an electrode of an organic EL device, a transparent conductive film for a semi-transmitting/semi-reflecting LCD, and oxide semiconductor film for driving a liquid crystal display and an oxide semiconductor film for driving an organic EL device. Furthermore, it is suitable as a raw material of an oxide semiconductor film for a switching device, a driving circuit device or the like of a liquid display apparatus, a thin film electroluminescence display apparatus, an electrophoresis display device, a moving particle display device or the like.

The method for producing a sputtering target of the invention is an excellent production method which can improve the productivity of a target, since the prefiring step or the reduction step is not necessary.

The invention claimed is:

1. A sputtering target containing oxides of indium (In), gallium (Ga) and zinc (Zn), which comprises a spinel structure compound shown by $ZnGa_2O_4$ and a homologous structure compound shown by $InGaO_3(ZnO)_m$ wherein m is an integer of 1 to 20, and wherein the atomic ratio shown by In/(In+Ga+Zn) and the atomic ratio shown by Ga/(In+Ga+Zn) satisfy the following relationship:

$$In/(In+Ga+Zn) > Ga/(In+Ga+Zn),$$

in the form of a sputtering target.

2. A sputtering target according to claim 1, which comprising a homologous structure compound shown by $InGaZnO_4$.

3. A sputtering target according to claim 1, wherein an atomic ratio shown by In/(In+Ga+Zn), an atomic ratio shown by Ga/(In+Ga+Zn) and an atomic ratio shown by Zn/(In+Ga+Zn) satisfy the following relationship:
   0.2<In/(In+Ga+Zn)<0.77
   0.2<Ga/(In+Ga+Zn)<0.50
   0.03<Zn/(In+Ga+Zn)<0.50,
provided that In/(In+Ga+Zn)>Ga/(In+Ga+Zn).

4. A sputtering target according to claim 1, wherein the sputtering target comprises a metal element with an atomic valency of positive tetravalency or higher, and the atomic ratio of the metal element with an atomic valency of positive tetravalency or higher relative to the total metal elements is 0.0001 to 0.2.

5. A sputtering target according to claim 4, wherein the metal element with an atomic valency of positive tetravalency or higher is one or more elements selected from tin, zirconium, germanium, cerium, niobium, tantalum, molybdenum and tungsten.

6. A sputtering target according to claim 1, which has a bulk resistance of less than $5 \times 10^{-3}$ Ω·cm.

7. A sputtering target according to claim 1, wherein the average diameter of the spinel structure compound shown by $ZnGa_2O_4$ is 10 μm or less.

8. A sputtering target according to claim 1, which has a sintered body density of 6.0 g/cm³ or more.

9. A sputtering target according to claim 1, which has a surface roughness (Ra) of 2 μm or less and an average transverse rupture strength of 50 MPa or more.

10. A sputtering target according to claim 1, wherein the content of each of Fe, Al, Si, Ni and Cu is 10 ppm (weight) or less.

* * * * *